(12) United States Patent
Nagano

(10) Patent No.: US 11,594,649 B2
(45) Date of Patent: Feb. 28, 2023

(54) PHOTOELECTRIC CONVERTER, PHOTOELECTRIC CONVERSION MODULE, AND ELECTRONIC INSTRUMENT

(71) Applicant: SEIKO EPSON CORPORATION, Tokyo (JP)

(72) Inventor: Daisuke Nagano, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 206 days.

(21) Appl. No.: 16/514,064

(22) Filed: Jul. 17, 2019

(65) Prior Publication Data

US 2020/0028004 A1 Jan. 23, 2020

(30) Foreign Application Priority Data

Jul. 17, 2018 (JP) .............................. JP2018-133998

(51) Int. Cl.
*H01L 31/0264* (2006.01)
*H01L 31/0236* (2006.01)
(Continued)

(52) U.S. Cl.
CPC ........ *H01L 31/02366* (2013.01); *G04C 10/02* (2013.01); *G04G 19/02* (2013.01); *G04R 20/04* (2013.01); *H01L 31/02008* (2013.01); *H01L 31/0264* (2013.01); *H01L 31/02168* (2013.01); *H01L 31/022425* (2013.01); *H01L 31/0392* (2013.01); *H01L 31/05* (2013.01); *H01L 31/0547* (2014.12)

(58) Field of Classification Search
CPC .......... H01L 31/02366; H01L 31/0547; H01L 31/02008; H01L 31/02168; H01L 31/022425; H01L 31/0264; H01L 31/0392; H01L 31/05
See application file for complete search history.

(56) References Cited

U.S. PATENT DOCUMENTS 4,427,839 A * 1/1984 Hall ..................... H01L 31/068
257/466
4,927,770 A * 5/1990 Swanson ............... H01L 31/061
257/458
(Continued)

FOREIGN PATENT DOCUMENTS

CN 102931289 A 2/2013
JP S53-33591 3/1978
(Continued)

*Primary Examiner* — Uyen M Tran
(74) *Attorney, Agent, or Firm* — Oliff PLC

(57) ABSTRACT

A photoelectric converter including a crystalline silicon substrate having a light receiving surface including a smooth section and a rough surface section having surface roughness greater than the surface roughness of the smooth section and a light transmissive inorganic film so provided as to overlap with the smooth section and the rough surface section, and the film thickness t1 of a portion of the inorganic film that is the portion where the inorganic film overlaps with the rough surface section is smaller than the film thickness t2 of a portion of the inorganic film that is the portion where the inorganic film overlaps with the smooth section. The arithmetic average roughness of the rough surface section is preferably greater than or equal to 0.1 μm.

9 Claims, 15 Drawing Sheets

(51) Int. Cl.
- *G04R 20/04* (2013.01)
- *G04G 19/02* (2006.01)
- *G04C 10/02* (2006.01)
- *H01L 31/02* (2006.01)
- *H01L 31/0224* (2006.01)
- *H01L 31/054* (2014.01)
- *H01L 31/05* (2014.01)
- *H01L 31/0392* (2006.01)
- *H01L 31/0216* (2014.01)

(56) References Cited

U.S. PATENT DOCUMENTS

| | | |
|---|---|---|
| 2009/0050198 A1 | 2/2009 | Mueller et al. |
| 2012/0111399 A1* | 5/2012 | Kondo ............... H01L 31/1804 136/256 |
| 2012/0298191 A1* | 11/2012 | Yamazaki ........... H01L 31/0747 136/255 |
| 2014/0034122 A1* | 2/2014 | Cousins .............. H01L 31/0682 257/E31.124 |
| 2015/0007874 A1* | 1/2015 | Hayashi ........... H01L 31/02168 136/256 |
| 2015/0024541 A1 | 1/2015 | Jaffrennou et al. |
| 2015/0268636 A1* | 9/2015 | Sawada ................ G04B 19/065 368/47 |
| 2018/0122964 A1* | 5/2018 | Adachi ............... H01L 31/0504 |
| 2019/0123221 A1* | 4/2019 | Konishi ............. H01L 31/0224 |

FOREIGN PATENT DOCUMENTS

| | | |
|---|---|---|
| JP | S57-2677 U | 1/1982 |
| JP | 2001-015776 A | 1/2001 |
| JP | 2001-203379 A | 7/2001 |
| JP | 2009-528687 A | 8/2009 |
| JP | 2012-064839 A | 3/2012 |
| JP | 2014-103259 A | 6/2014 |
| JP | 2015-515747 A | 5/2015 |
| JP | 2016-176957 A | 10/2016 |
| WO | WO-2017217219 A1 * | 12/2017 ..... H01L 31/022466 |

* cited by examiner

FIG. 9A

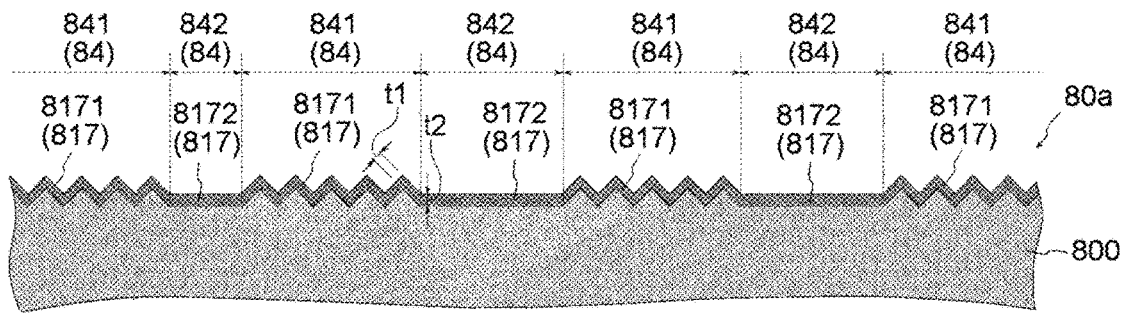

FIG. 9B

| ARITHMETIC AVERAGE ROUGHNESS Ra | GREATER THAN OR EQUAL TO 0.1 μm BUT SMALLER THAN 0.2 μm | GREATER THAN OR EQUAL TO 0.2 μm BUT SMALLER THAN OR EQUAL TO 0.4 μm | GREATER THAN 0.4 μm |
|---|---|---|---|
| IMAGE OF FLAT SURFACE UNDER ELECTRON MICROSCOPE | | | |
| CONCEPTUAL CROSS SECTION | | | |

FIG. 9C

| DIFFERENCE IN SURFACE ROUGHNESS (μm) | 0.001 | 0.005 | 0.009 | 0.01 | 0.05 | 0.10 | 0.20 | 0.30 | 0.40 |
|---|---|---|---|---|---|---|---|---|---|
| VISIBILITY | × | × | × | ○ | ○ | ◎ | ◎ | ◎ | ◎ |
| FORMABILITY OF SMOOTH SECTIONS | × | × | × | △ | △ | ◎ | ◎ | ◎ | ◎ |
| ABILITY TO UNIFORMLY FORM ROUGH SURFACE SECTIONS (FORMABILITY) | × | × | × | △ | △ | ◎ | ◎ | ◎ | ◎ |

PHOTOELECTRIC CONVERTER, PHOTOELECTRIC CONVERSION MODULE, AND ELECTRONIC INSTRUMENT

The present application is based on, and claims priority from JP Application Serial Number 2018-133998, filed Jul. 17, 2018, the disclosure of which is hereby incorporated by reference herein in its entirety.

BACKGROUND

1. Technical Field

The present disclosure relates to a photoelectric converter, a photoelectric conversion module, and an electronic instrument.

2. Related Art

There has been a proposed wearable electronic instrument (wristwatch) that receives a radio wave from a position information satellite used in a positioning system, such as the GPS (global positioning system), and acquires time contained in a positioning signal and detects the current position.

For example, JP-A-2016-176957 discloses a wristwatch including a wristwatch case, a dial, a timepiece module including an antenna that is disposed below the dial and receives a radio wave from a position information satellite, and a solar panel provided between the dial and the timepiece module. The thus configured wristwatch, in which the dial transmits light, can generate power necessary for the action of the timepiece module by allowing the solar panel to be irradiated with outside light having passed through the dial.

On the other hand, the radio wave transmitted from the position information satellite is an ultrahigh-frequency radio wave, and a high-frequency circuit needs to be activated to receive the ultrahigh-frequency radio wave, resulting in a problem of an increase in power consumed by the wristwatch.

To handle the increase in power consumption, a study on maximization of the area of the solar panel to increase the amount of generated power has been conducted. In the case of a compact electronic instrument, such as a wristwatch, letters, figures, patterns, and other objects need to be placed also on the light receiving surface of the solar panel so that the solar panel does not compromise stylish design of the wristwatch. Placing paint or any other material on the light receiving surface, however, reduces the amount of light received by the painted portion, resulting in a problem of a decrease in the amount of generated power.

In contrast, JP-A-2001-203379 discloses a method for providing a solar cell with an alignment mark with no use of paint or any other material. Specifically, JP-A-2001-203379 discloses a solar cell in which an alignment mark having a texture structure is provided on the rear surface of a cell substrate. In the thus configured solar cell, the alignment mark having a texture structure is clearly visually recognizable, whereby electrodes formed on the rear surface of the cell substrate can be precisely positioned.

JP-A-2016-176957 and JP-A-2001-203379 are examples of the related art.

The alignment mark described in JP-A-2001-203379 is, however, used only in the step of manufacturing the solar cell and therefore needs to be provided on the rear surface of the cell substrate. That is, since the alignment mark described in JP-A-2001-203379 is not provided on the front surface, that is, the light receiving surface, a user of the wristwatch does not visually recognize the alignment mark. Further, the way in which the alignment mark having a texture structure is viewed, for example, the chromaticity and lightness of the alignment mark are greatly affected by the shape of the texture structure, but it is difficult to perform fine control of the shape of the texture structure. It is therefore difficult to use such an alignment mark on the light receiving surface, where the stylish design is regarded as an important factor.

SUMMARY

An advantage of some aspects of the present disclosure is to solve the problem described above and the present disclosure can be implemented in the form of the following application examples.

A photoelectric converter according to an application example of the present disclosure includes a crystalline silicon substrate having a light receiving surface including a smooth section and a rough surface section having surface roughness greater than surface roughness of the smooth section and a light transmissive inorganic film so provided as to overlap with the smooth section and the rough surface section, and a film thickness t1 of a portion of the inorganic film that is a portion where the inorganic film overlaps with the rough surface section is smaller than a film thickness t2 of a portion of the inorganic film that is a portion where the inorganic film overlaps with the smooth section.

BRIEF DESCRIPTION OF THE DRAWINGS

FIG. 9A is a cross-sectional view taken along the line A-A in FIG. 8.

FIG. 9B shows the relationship of the magnitude of arithmetic average roughness Ra of rough surface sections with electron microscope images of the rough surface sections in a plan view and conceptual cross sections thereof.

FIG. 9C shows the relationship of the difference in arithmetic average roughness Ra between the rough surface sections and smooth sections with the visibility of letters or the like and the formability of the rough surface sections and the smooth sections.

DESCRIPTION OF EXEMPLARY EMBODIMENTS

A photoelectric converter, a photoelectric conversion module, and an electronic instrument according to a preferable embodiment of the present disclosure will be described below in detail with reference to the accompanying drawings.

Electronic Timepiece

An electronic timepiece that is the electronic instrument according to the embodiment of the present disclosure will first be described. The electronic timepiece is so configured that when a light receiving surface thereof is irradiated with light, a built-in solar cell (photoelectric conversion module) generates power (performs photoelectric conversion) and the power generated by the power generation is used as driving power.

Figure 1:
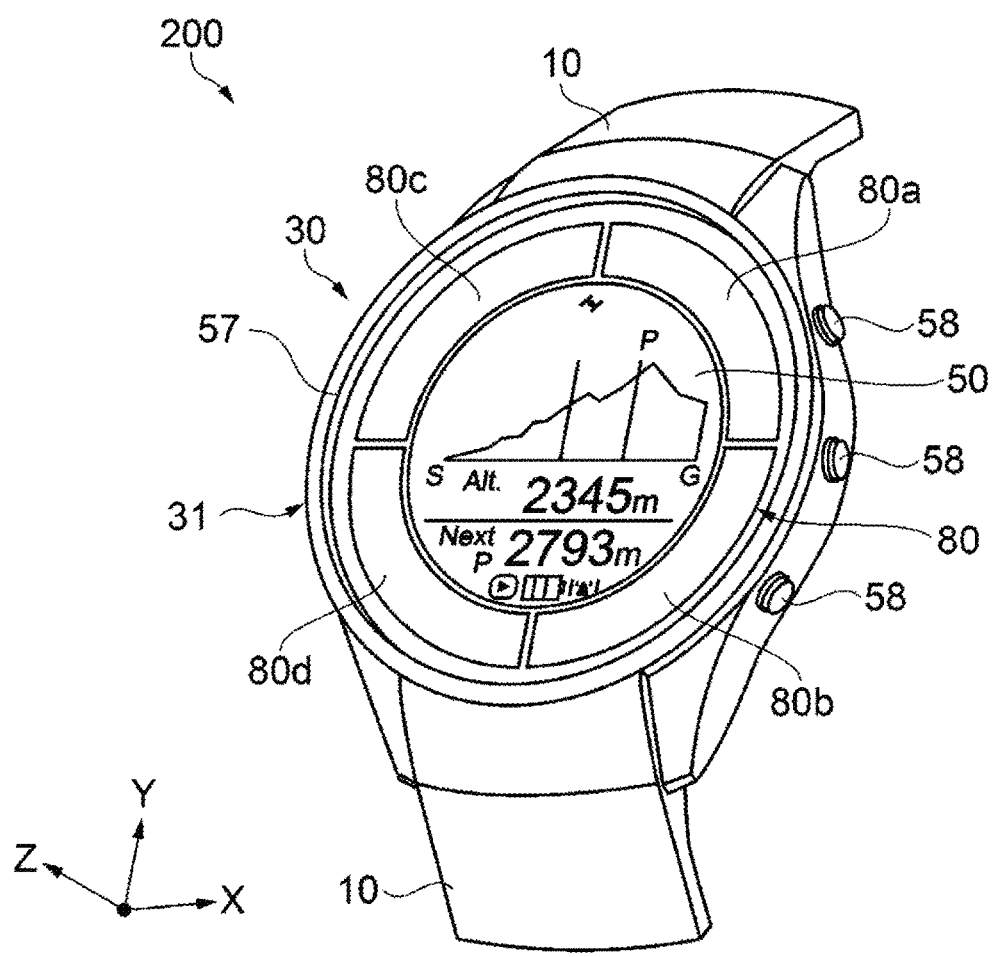
FIG. 1 is a perspective view showing an electronic timepiece that is an electronic instrument according to an embodiment of the present disclosure.
Figure 2:
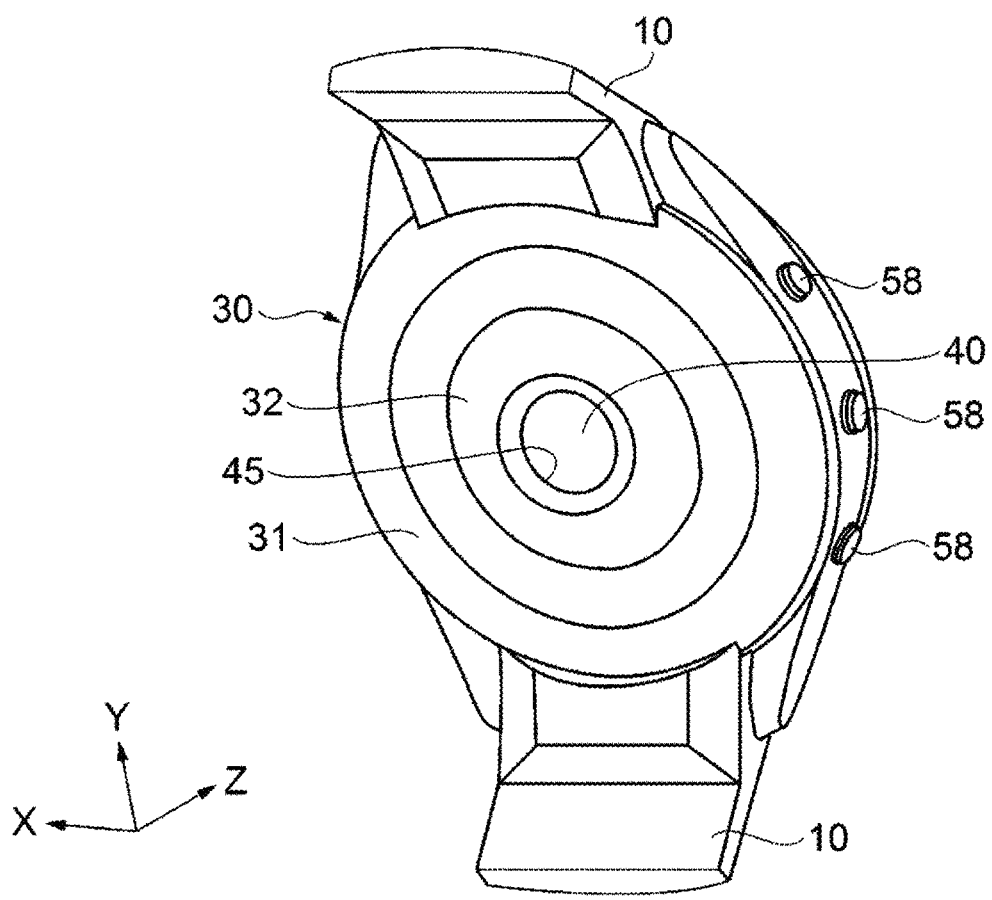
FIG. 2 is another perspective view showing the electronic timepiece that is the electronic instrument according to the embodiment of the present disclosure.
Figure 3:
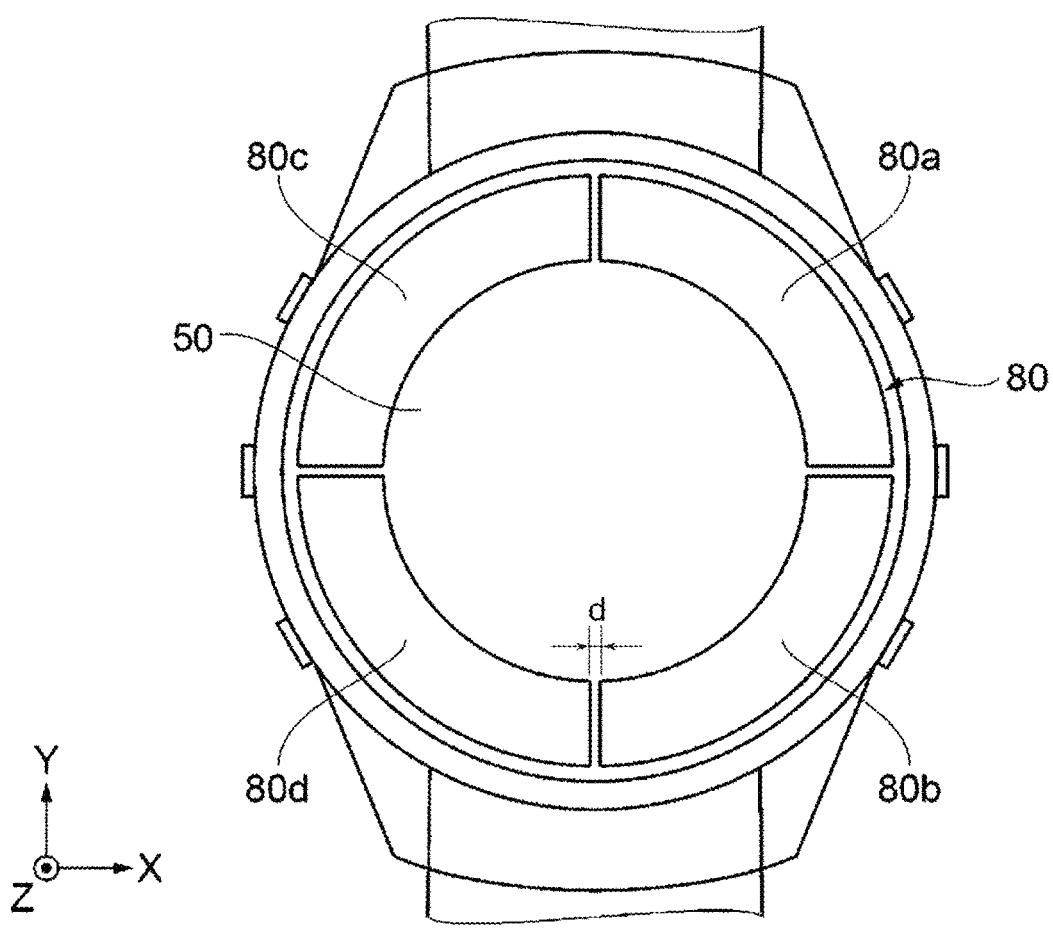
FIG. 3 is a plan view of the electronic timepiece shown in FIGS. 1 and 2.
Figure 4:
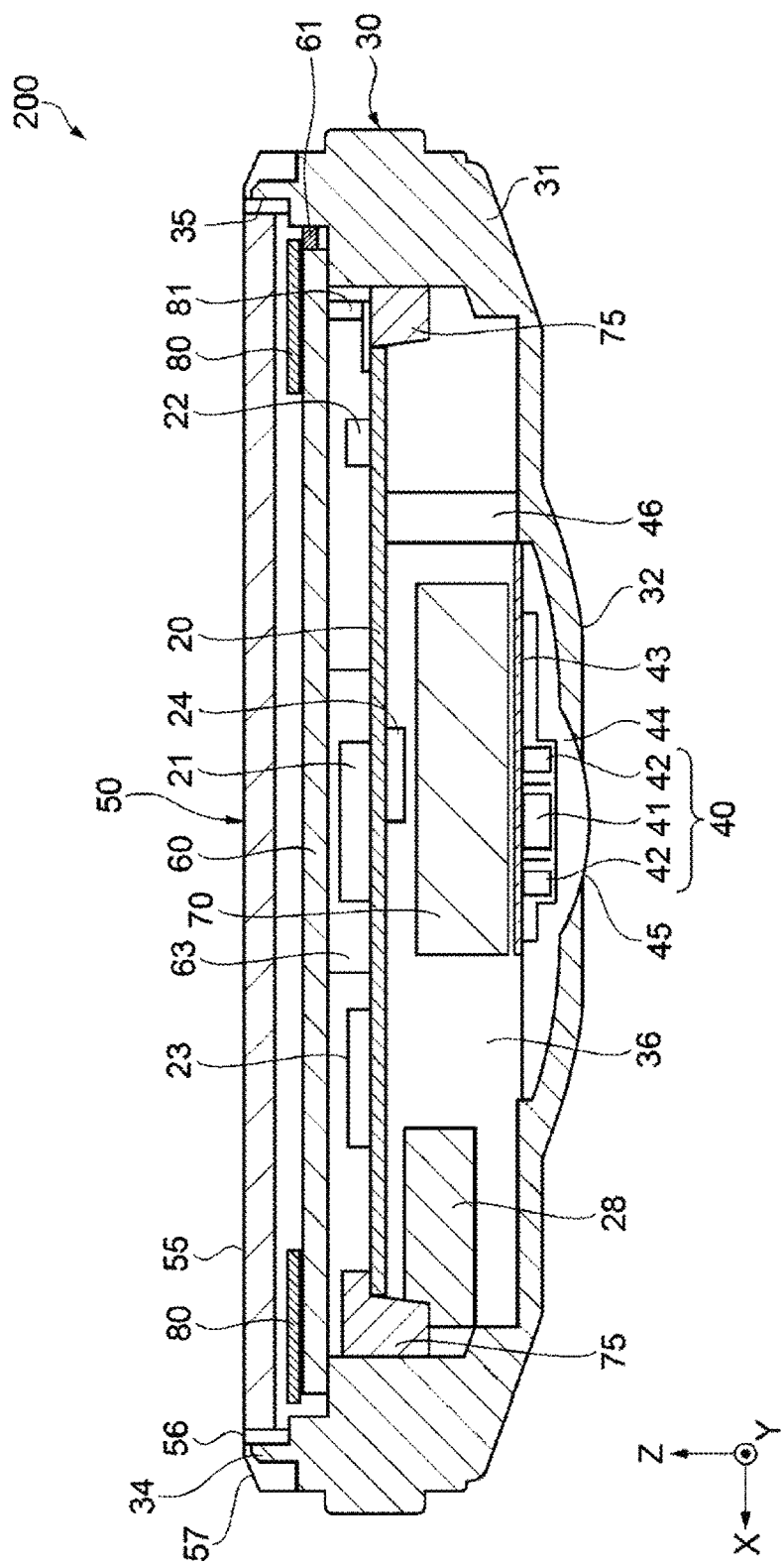
FIG. 4 is a longitudinal cross-sectional view of the electronic timepiece shown in FIGS. 1 and 2.

FIGS. 1 and 2 are each a perspective view showing the electronic timepiece that is the electronic instrument according to the embodiment of the present disclosure. FIG. 1 is a perspective view showing the exterior appearance of the electronic timepiece viewed from the front side thereof, and FIG. 2 is a perspective view showing the exterior appearance of the electronic timepiece viewed from the rear side thereof. FIG. 3 is a plan view of the electronic timepiece shown in FIGS. 1 and 2, and FIG. 4 is a longitudinal cross-sectional view of the electronic timepiece shown in FIGS. 1 and 2.

An electronic timepiece 200 includes an instrument main body 30, which includes a case 31, a solar cell 80 (photoelectric conversion module), a display section 50, and a photosensor unit 40, and two bands 10 attached to the case 31.

In the present specification, out of the electronic timepiece 200 and the solar cell 80, the side facing a light source that emits light to be incident on the solar cell 80 is called a "front side," and the side opposite the front side is called a "rear side." The directional axis extending in the direction perpendicular to light receiving surfaces 84 of the solar cell 80 is called an axis Z. The orientation from the rear side of the electronic timepiece 200 toward the front side thereof is called a "direction +Z," and the orientation opposite the "direction +Z" is called a "direction −Z."

On the other hand, the two axes perpendicular to the axis Z are called an "axis X" and an "axis Y." Out of the two axes, the directional axis along which the two bands 10 are connected to each other is the axis Y, and the directional axis perpendicular to the axis Y is the axis X. The orientation toward the upper side of the display section 50 is called a "direction +Y," and the orientation toward the lower side of the display section 50 is called a "direction −Y." The rightward orientation in FIG. 3 is called a "direction +X," and the leftward orientation in FIG. 3 is called a "direction −X."

The configurations of the electronic timepiece 200 will be sequentially described below.

Instrument Main Body

The instrument main body 30 includes an enclosure including the case 31, which has front and rear openings, a windshield 55, which is so provided as to close the front opening, a bezel 57, which is so provided as to cover the front surface of the case 31 and the side surface of the windshield 55, and a transparent cover 44, which is so provided as to close the rear opening. A variety of components that will be described later are accommodated in the enclosure.

Out of the components that form the enclosure, the case 31 has a ring-like shape and includes a front opening 35, into which the windshield 55 is fittable, and a rear opening (measurement window 45) into which the transparent cover 44 is fittable.

Part of the rear side of the case 31 forms a convex section 32, which is so formed to protrude. A vertex portion of the convex section 32 has an opening, and the transparent cover 44 is fit into the opening with part of the transparent cover 44 protruding beyond the opening.

The case 31 is made, for example, of a metal material, such as stainless steel and a titanium alloy, a resin material, or a ceramic material. The case 31 may be an assembly of a plurality of portions. In this case, the portions may be made of different materials.

A plurality of operation sections 58 (operation buttons) are provided on the outer side surface of the case 31.

A protrusion 34, which protrudes in the direction +Z, is formed along the outer edge of the opening 35 provided on the front side of the case 31. The bezel 57, which has a ring-like shape, is so provided as to cover the protrusion 34.

Further, the windshield 55 is provided in the bezel 57. The side surface of the windshield 55 and the bezel 57 are bonded to each other via a joining member 56, such as a gasket and an adhesive.

The windshield 55 and the transparent cover 44 are made, for example, of a glass material, a ceramic material, or a resin material. The windshield 55 transmits light, whereby a content displayed in the display section 50 and the light receiving surfaces 84 of the solar cell 80 are visually recognizable through the windshield 55. Further, the transparent cover 44 also transmits light, and the photosensor unit 40 is therefore allowed to function as a biological information measuring section.

An internal space 36 in the enclosure is a closed space that can accommodate a variety of components that will be described later.

The instrument main body 30 includes, as the elements accommodated in the internal space 36, a circuit substrate 20, an orientation sensor 22 (geomagnetic sensor), an acceleration sensor 23, a GPS antenna 28, the photosensor unit 40, an electro-optic panel 60 and an illuminator 61, which form the display section 50, a secondary cell 70, and the solar cell 80. In addition to the elements described above, the instrument main body 30 may further include a variety of sensors, such as a pressure sensor that calculates the altitude, the water depth, and other quantities, a temperature sensor that measures the temperature and an angular velocity sensor, a vibrator, and other components.

The circuit substrate 20 is a substrate including wiring lines that electrically connect the elements described above to each other. Further, a CPU 21 (central processing unit) and another circuit device 24, including a control circuit that controls the actions of the elements described above, drive circuits, and other circuits, are mounted on the circuit substrate 20.

The solar cell 80, the electro-optic panel 60, the circuit substrate 20, and the photosensor unit 40 are arranged in the presented order from the side facing the windshield 55. The solar cell 80 is therefore so disposed as to be close to the windshield 55, whereby a large amount of outside light is efficiently incident on the solar cell 80. As a result, the photoelectric conversion efficiency of the solar cell 80 can be maximized.

The elements accommodated in the instrument main body 30 will be described below in more detail.

An end portion of the circuit substrate 20 is attached to the case 31 via a circuit case 75.

Connection wiring sections 63 and 81 are electrically connected to the circuit substrate 20. The circuit substrate 20 is electrically connected to the electro-optic panel 60 via the connection wiring section 63. The circuit substrate 20 is electrically connected to the solar cell 80 via the connection wiring section 81. The connection wiring sections 63 and 81 are each formed, for example, of a flexible circuit substrate and are therefore efficiently routed through gaps in the internal space 36.

The orientation sensor 22 and the acceleration sensor 23 can detect information on the body motion of a user who wears the electronic timepiece 200. The orientation sensor 22 and the acceleration sensor 23 each output a signal that changes in accordance with the user's body motion and transmit the signal to the CPU 21.

The CPU 21 includes a circuit that controls a GPS receiver (not shown) including the GPS antenna 28, a circuit that drives the photosensor unit 40 to measure the user's pulse wave or any other biological information, a circuit that drives the display section 50, a circuit that controls the power generation performed by the solar cell 80, and other circuits.

The GPS antenna 28 receives radio waves from a plurality of position information satellites. The instrument main body 30 further includes a signal processor that is not shown. The signal processor performs positioning calculation based on a plurality of positioning signals received via the GPS antenna 28 to acquire time and position information. The signal processor transmits the information to the CPU 21.

The photosensor unit 40 is the biological information measuring section, which detects the user's pulse wave or any other biological information. The photosensor unit 40 shown in FIG. 4 is a photoelectric sensor including a light receiver 41, a plurality of light emitters 42 provided in a region outside the light receiver 41, and a sensor substrate 43, on which the light receiver 41 and the light emitters 42 are mounted. The light receiver 41 and the light emitters 42 face the measurement window 45 of the case 31 via the transparent cover 44 described above. The circuit substrate 20 is electrically connected to the photosensor unit 40 via a connection wiring section 46 provided as part of the instrument main body 30.

The thus configured photosensor unit 40 radiates light emitted from the light emitters 42 to a subject (user's skin, for example) and receives the light reflected off the subject with the light receiver 41 to detect the pulse wave. The photosensor unit 40 transmits information on the detected pulse wave to the CPU 21.

The photoelectric sensor may be replaced with another sensor, such as an electrocardiograph and an ultrasonic sensor.

The instrument main body 30 further includes a communication section that is not shown. The communication section transmits a variety of pieces of information acquired by and stored in the instrument main body 30, results of computation performed by the CPU 21, and other pieces of information to an external instrument.

The display section 50 allows the user to visually recognize the content displayed on the electro-optic panel 60 through the windshield 55. The user can thus recognize, for example, information acquired from any of the elements described above in the form of letters or an image displayed on the display section 50.

The electro-optic panel 60 may, for example, be a liquid crystal display device, an organic EL (electro-luminescence) display device, an electrophoretic display device, or an LED (light emitting diode) display device.

FIG. 4 shows a case by way of example where the electro-optic panel 60 is a reflective display device (for example, reflective liquid crystal display device and electrophoresis display device). The display section 50 therefore includes the illuminator 61 so provided as to face a light incident surface of a light guide plate (not shown) provided as part of the electro-optic panel 60. The illuminator 61 can, for example, be an LED device. The illuminator 61 and the light guide plate function as a front light for the reflective display device.

In a case where the electro-optic panel 60 is a transmissive display device (for example, transmissive liquid crystal display device), the front light may be replaced with a backlight.

In a case where the electro-optic panel 60 is a self-luminous display device (for example, organic EL display device or LED display device) or a case where the electro-optic panel 60 is not a self-luminous display device but is a display device using outside light, the front light and the backlight can be omitted.

The secondary cell 70 is connected to the circuit substrate 20 via wiring lines that are not shown. The power outputted from the secondary cell 70 can thus be used to drive the elements described above. The power generated by the solar cell 80 can charge the secondary cell 70.

The electronic timepiece 200 has been described above, and the electronic instrument according to the embodiment of the present disclosure is not limited to an electronic timepiece and may instead, for example, be an analog timepiece, a mobile phone terminal, a smartphone, a tablet terminal, a wearable terminal, and a camera.

Solar Cell

First Embodiment

The solar cell 80 that is a photoelectric conversion module according to a first embodiment of the present disclosure will next be described in detail.

The solar cell 80 is a photoelectric conversion module that converts optical energy into electrical energy.

Figure 5:
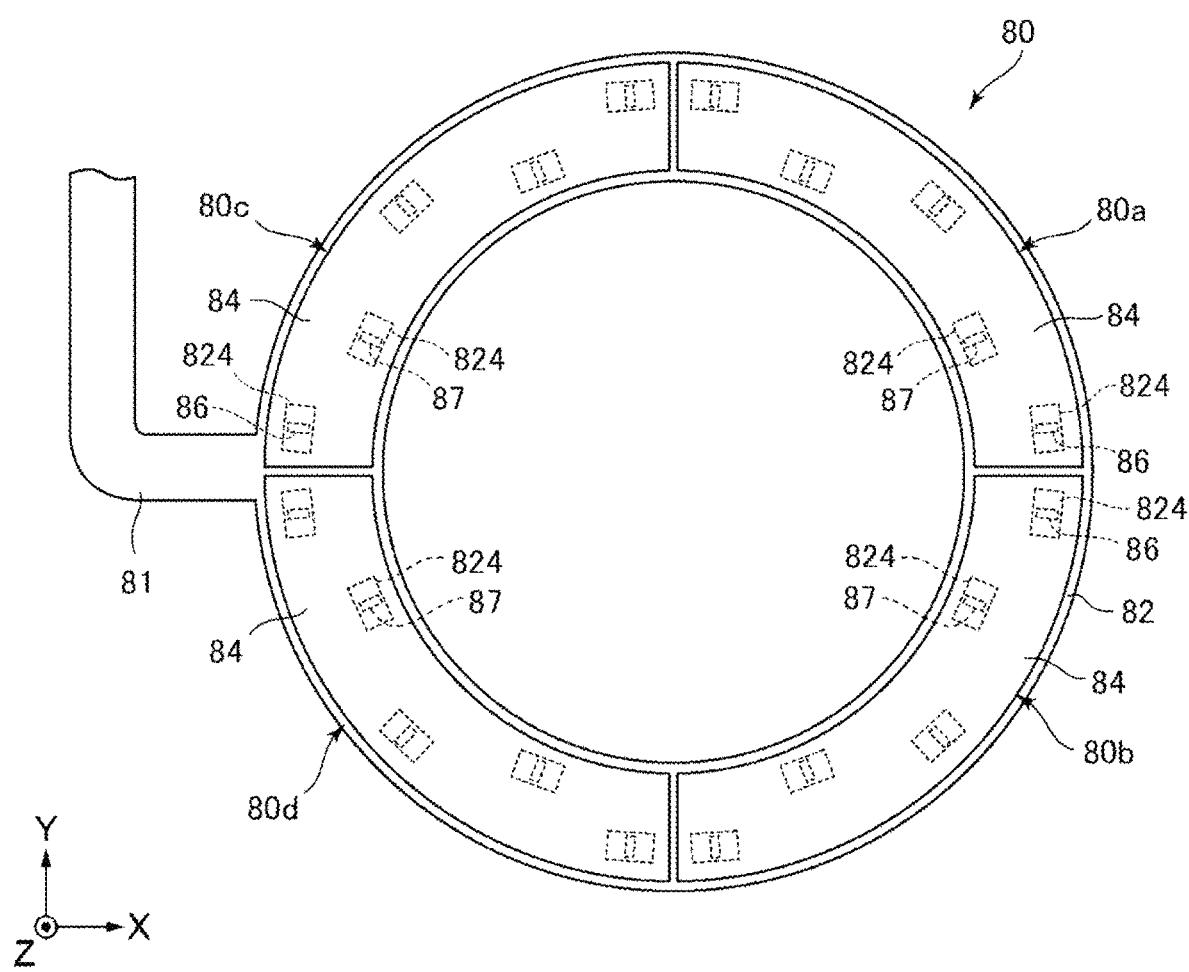
FIG. 5 is a plan view showing only a photoelectric conversion module out of the components of the electronic timepiece shown in FIG. 4.
Figure 6:
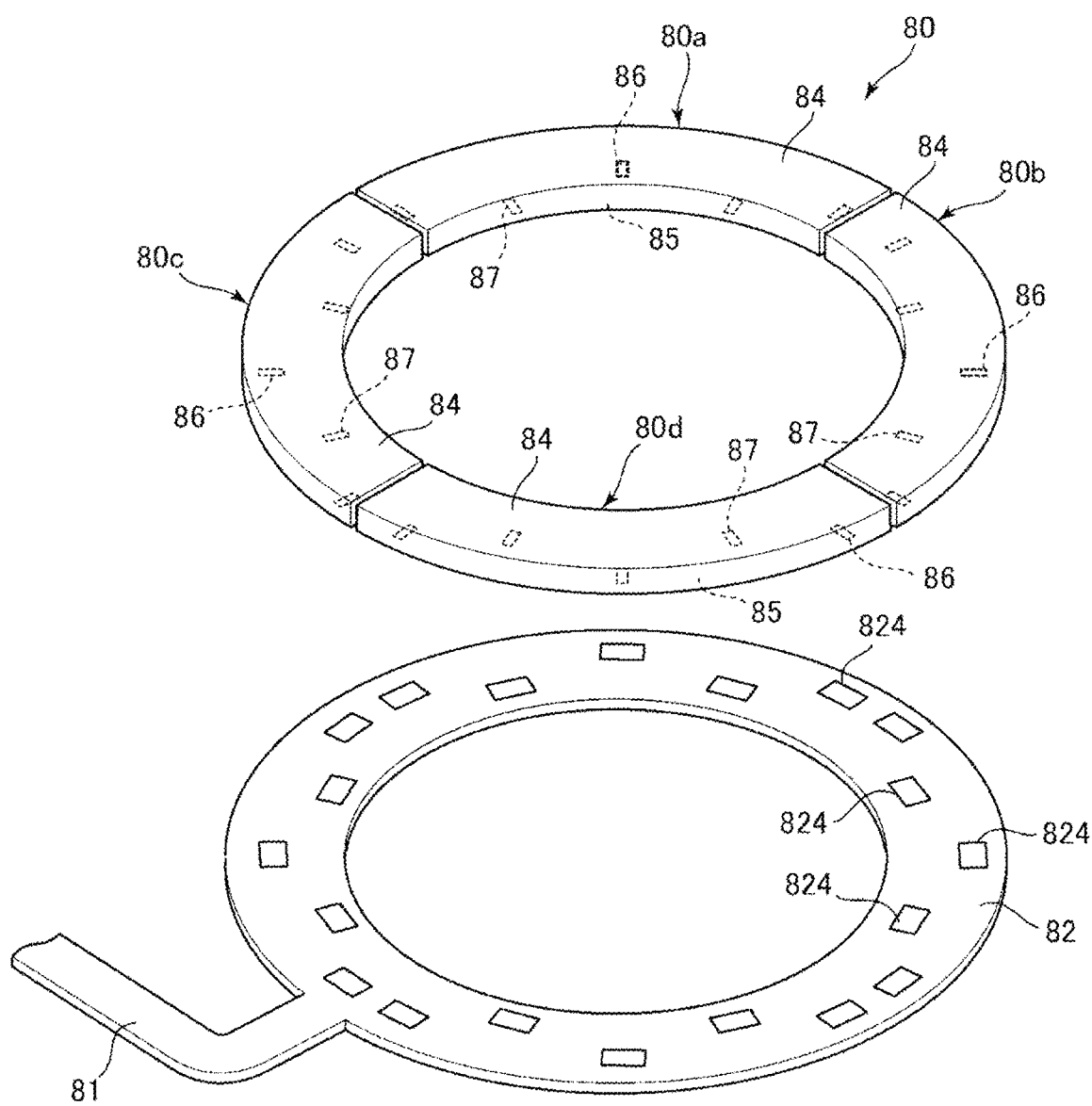
FIG. 6 is an exploded perspective view of the photoelectric conversion module shown in FIG. 5.

FIG. 5 is a plan view showing only the solar cell 80 out of the components of the electronic timepiece 200 shown in FIG. 4. FIG. 6 is an exploded perspective view of the solar cell 80 shown in FIG. 5.

The solar cell 80 (photoelectric conversion module) shown in FIG. 5 is provided between the windshield 55 and the electro-optic panel 60 and includes four cells 80a, 80b, 80c, and 80d (photoelectric converters) and a wiring substrate 82, which is electrically connected to the four cells 80a, 80b, 80c, and 80d.

The cells 80a, 80b, 80c, and 80d each have a plate-like shape having a principal surface oriented in the Z-axis direction. The cells 80a, 80b, 80c, and 80d each include an Si substrate 800, which will be described later. The Si substrate 800 has two principal surfaces that are front and rear principal surfaces, and the principal surface facing the windshield 55 forms the light receiving surfaces 84, which receives outside light. On the other hand, the principal surface opposite the light receiving surfaces 84 forms electrode surfaces 85, on which electrodes that will be described later are disposed. In a case where the light receiving surfaces 84 are each provided with a texture structure that will be described later, the surface excluding the texture structure is perpendicular to the axis Z.

The solar cell 80 shown in FIG. 5 has a ring-like shape in the plan view. In other words, the four cells 80a, 80b, 80c, and 80d are so arranged with a slight gap therebetween that the solar cell 80 in the plan view has a ring-like shape as a whole having circular inner and outer edges (circular inner and outer shapes).

On the other hand, since the opening 35 of the case 31 described above has a circular shape, the inner edge of the opening 35 has a curved line. The (inner edge of the) opening 35 of the case 31 may instead have, for example, a straight line and a curved line.

The term "outer edge of the solar cell 80" refers to a portion of the contour of the solar cell 80 that is the portion facing the outer side of the opening 35, and the term "inner edge of the solar cell 80" refers to a portion of the contour of the solar cell 80 that is the portion facing the center of the opening 35.

The inner and outer edges of the four cells 80a, 80b, 80c, and 80d are preferably part of circles having the same center (concentric circles). In other words, when the assembly of the four cells 80a, 80b, 80c, and 80d forms a ring, the inner and outer circles of the ring are preferably concentric circles. An electronic timepiece 200 that excels, in particular, in decorative design can be achieved.

In the present embodiment, the assembly of the four cells 80a, 80b, 80c, and 80d forms the solar cell 80, and the number of cells may instead be one, two or more, or any other arbitrary number.

In the present embodiment, the solar cell 80 has a ring shape in the plan view and may instead have a multiple-ring shape.

One or more of the four cells 80a, 80b, 80c, and 80d may be omitted, or the cells may have shapes different from one another.

The length d (see FIG. 3) of the gap between the cells 80a, 80b, 80c, and 80d is not limited to a specific value and is preferably greater than or equal to 0.05 mm but smaller than or equal to 3 mm, more preferably greater than or equal to 0.1 mm but smaller than or equal to 1 mm. Setting the length d of the gaps to fall within one of the ranges described above makes end surfaces 808 shown in FIG. 7, which will be described later, more difficult to see when the solar cell 80 is viewed from the side facing the light receiving surfaces 84. Setting the length d as described above is also useful from the viewpoint of avoidance of a problem of difficulty in assembling the solar cell 80 and probability of contact between the cells due to too short a length d between the gaps.

The semiconductor substrate provided in the solar cell 80 is a silicon substrate. The semiconductor substrate may be an amorphous semiconductor but preferably has crystallinity. The crystallinity refers to single crystallinity or polycrystallinity. The solar cell 80 including a semiconductor substrate having the crystallinity has higher photoelectric conversion efficiency than that of a solar cell including an amorphous semiconductor substrate. To generate the same power, the area of the thus formed solar cell 80 can be reduced. The solar cell 80 including a semiconductor substrate having the crystallinity allows the electronic timepiece 200 to have both high photoelectric conversion efficiency and good decorative design.

In particular, the semiconductor substrate preferably has single crystallinity. The photoelectric conversion efficiency of the solar cell 80 is thus particularly increased. The photoelectric conversion efficiency and decorative design can both be maximized. In particular, the footprint of the solar cell 80 is reduced, whereby the decorative design of the electronic timepiece 200 can be further enhanced. As another advantage, the photoelectric conversion efficiency is unlikely to decrease even under a low-illuminance light condition, such as under room light.

The semiconductor substrate having single crystallinity includes a semiconductor substrate that is entirely single crystalline and a semiconductor substrate that is partially polycrystalline or amorphous. In the latter case, the single crystalline portion preferably has a relatively large volume (single crystalline portion is at least 90% of entire volume, for example).

The solar cell 80 is preferably of a rear surface electrode type. Specifically, electrode pads 86 and 87 (connectors) are provided on the electrode surfaces 85 of the four cells 80a, 80b, 80c, and 80d, as shown in FIG. 6. The electrode pads 86 are each a positive electrode, and the electrode pads 87 are each a negative electrode. Power can therefore be extracted from the electrode pads 86 and 87 via wiring lines.

The rear surface electrode type therefore allows all electrode pads to be disposed on the electrode surfaces 85 (rear surfaces). The light receiving surfaces 84 can therefore maximized, whereby the amount of generated power can be increased as the light receiving area is maximized. In addition, degradation in decorative design due to the electrode pads provided on the light receiving surfaces 84 can be avoided. The decorative design of the electronic timepiece 200 can therefore be further enhanced.

In the solar cell 80, the cells preferably each include a plurality of electrode pads 86 and 87, as shown in FIG. 5. The cells 80a, 80b, 80c, and 80d can thus be more reliably connected electrically and mechanically to the wiring substrate 82.

The plurality of electrode pads 86 are arranged along the outer edge of the solar cell 80. On the other hand, the plurality of electrode pads 87 are arranged along the inner edge of the solar cell 80. The arrangement described above allows connection points to be provided along the direction in which the solar cell 80 extends (circumferential direction). Therefore, the solar cell 80 can be more reliably fixed, and the connection resistance between the solar cell 80 and the wiring substrate 82 can be sufficiently lowered.

Figure 7:
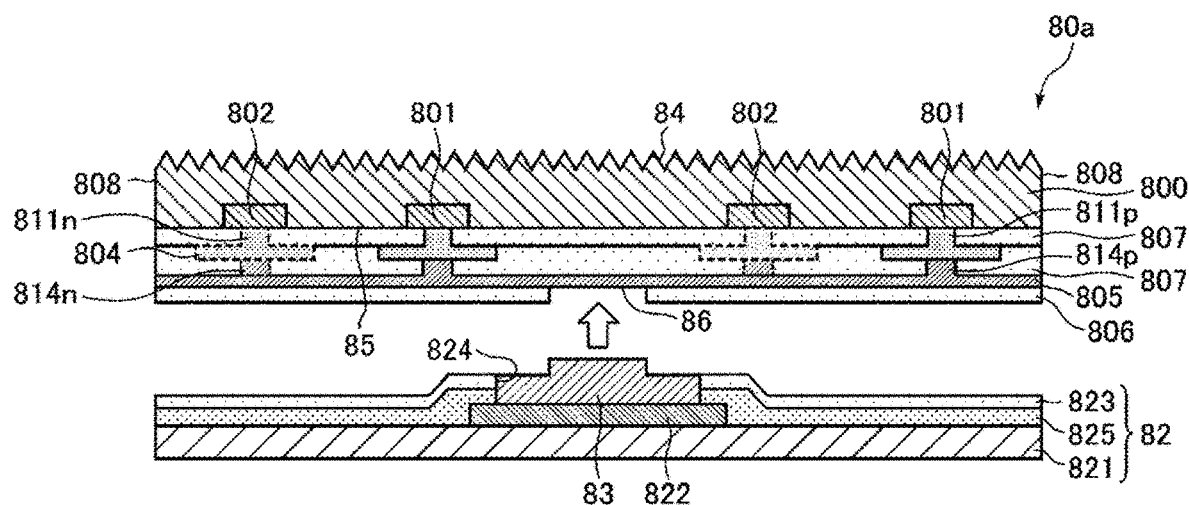
FIG. 7 is an exploded cross-sectional view of the photoelectric conversion module shown in FIG. 5.
Figure 8:
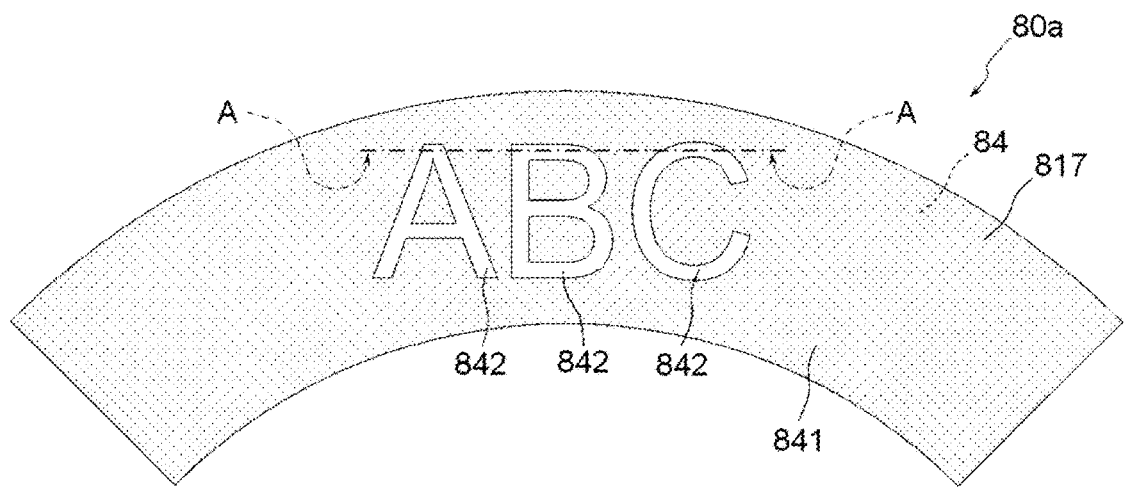
FIG. 8 is a plan view showing a light receiving surface of a photoelectric converter shown in FIG. 6.

FIG. 7 is an exploded cross-sectional view of the solar cell 80 shown in FIG. 5. FIG. 8 is a plan view showing the light receiving surface 84 of the cell 80a shown in FIG. 6. FIG. 9A is a cross-sectional view taken along the line A-A in FIG. 8. In FIG. 7, a passivation film 817, which will be described later, is omitted.

The solar cell 80 shown in FIG. 7 includes the cell 80a and the wiring substrate 82.

Wiring Substrate

The wiring substrate 82 includes an insulating substrate 821 and conductive films 822 provided on the insulating substrate 821.

The wiring substrate 82 is so provided as to overlap with the four cells 80a, 80b, 80c, and 80d. The thus configured wiring substrate 82 includes the insulating substrate 821, the conductive films 822 provided on the insulating substrate 821, and an insulating film 823, which includes openings 824 in the portions where the insulating film 823 overlaps with the conductive films 822.

The sentence "the wiring substrate 82 overlaps with the four cells 80a, 80b, 80c, and 80d" refers to the state in which the wiring substrate 82 overlap with at least one of the four cells in the plan view of the wiring substrate 82. In this case, the wiring substrate 82 does not necessarily overlap with one entire cell and only needs to overlap with at least part of the cell.

In the present embodiment, the wiring substrate 82 overlaps with all the four cells 80a, 80b, 80c, and 80d.

The insulating substrate 821 is formed, for example, of a polyimide substrate, a polyethylene terephthalate substrate, or any of a variety of other resin substrates.

The conductive films 822 are made, for example, of copper or a copper alloy, aluminum or an aluminum alloy, or silver or a silver alloy.

The insulating film 823 is made, for example, of a polyimide resin, a polyethylene terephthalate resin, or any of a variety of other resin materials.

The insulating substrate 821 and the insulating film 823 are bonded to each other via a bonding layer 825.

The bonding layer 825 is made, for example, of an epoxy-based adhesive, a silicone-based adhesive, an olefin-based adhesive, or an acrylic adhesive.

The thickness of the wiring substrate 82 is not limited to a specific value and is preferably greater than or equal to 50 µm but smaller than or equal to 500 µm, more preferably greater than or equal to 100 µm but smaller than or equal to 300 µm. Setting the thickness of the wiring substrate 82 to fall within one of the ranges described above imparts adequate flexibility to the wiring substrate 82. Adequate deformability is thus imparted to the wiring substrate 82. Therefore, even when stress is induced, for example, in the cell 80a, deformation of the wiring substrate 82 can suppress concentration of the stress. As a result, warpage or any other failure of the cell 80a can be avoided.

Cell

On the other hand, the cell 80a includes the Si substrate 800, p+ impurity regions 801 and n+ impurity regions 802 formed in the Si substrate 800, finger electrodes 804, which are connected to the p+ impurity regions 801 and the n+ impurity regions 802, and a bus bar electrode 805, which is connected to the finger electrodes 804. FIG. 7 only shows the bus bar electrode 805 and the electrode pads 86 (positive electrodes) connected to the p+ impurity regions 801 but does not show the bus bar electrode or the electrode pads (negative electrodes) connected to the n+ impurity regions 802 for ease of illustration. Further, in FIG. 7, n+ contacts 811n, which are connected to the n+ impurity regions 802, the finger electrodes 804, and n-type via wiring lines 814n are drawn with broken lines, which indicate that the n+ contacts 811n, the finger electrodes 804, or the n-type via wiring lines 814n are not electrically connected to the bus bar electrode 805.

The following description will be made of the cell 80a as a representative example, and the same description holds true for the cells 80b, 80c, and 80d.

Si Substrate

The Si substrate 800 is, for example, an Si(100) substrate. The crystal plane of the Si substrate 800 is not limited to a specific plane and may be a crystal plane other than the Si(100) plane.

The concentration of each impurity element other than the primary constituent element of the Si substrate 800 (semiconductor substrate) is preferably as low as possible and is more preferably lower than or equal to $1 \times 10^{11}$ [atoms/cm$^2$], still more preferably lower than or equal to $1 \times 10^{10}$ [atoms/cm$^2$]. The concentration of each impurity element that falls within one of the ranges described above can suppress the effect of the impurity in the Si substrate 800 on the photoelectric conversion to be sufficiently small. As a result, a solar cell 80 having a small area but capable of generation of sufficient power can be achieved. Further, as another advantage, the photoelectric conversion efficiency is unlikely to decrease even under a low-illuminance light condition, such as under room light.

The concentration of each impurity element of the Si substrate 800 can be measured, for example, by using an inductively coupled plasma-mass spectrometry (ICP-MS) method.

Part of the bus bar electrode 805 connected to the p+ impurity regions 801 is exposed via a passivation film 806, which will be described later, and forms the electrode pads 86 described above. On the other hand, part of the bus bar electrode 805 (see FIG. 10) connected to the n+ impurity regions 802 is exposed via the passivation film 806, which will be described later, and forms the electrode pads 87 described above.

The electrode pads 86 are connected to the wiring substrate 82 via conductive connectors 83, as shown in FIG. 7. Similarly, the electrode pads 87 are also connected to the wiring substrate 82 via conductive connectors that are not shown.

The conductive connectors 83 are, for example, conductive paste, a conductive sheet, a metal material, solder, or a brazing filer metal.

A texture structure is formed along the light receiving surface 84 of the Si substrate 800. The texture structure refers, for example, to irregularities having an arbitrary shape. Specifically, the texture structure is formed, for example, of a large number of pyramidal protrusions formed along the light receiving surface 84. Providing the texture structure can suppress reflection of outside light reflected off the light receiving surface 84 and therefore allows an increase in the amount of light incident on the Si substrate 800. Further, the texture structure can trap the outside light incident via the light receiving surface 84 in the Si substrate 800, whereby the photoelectric conversion efficiency can be increased.

In a case where the Si substrate 800 is a substrate having an Si(100) principal plane, a texture structure having pyramidal protrusions each having an Si(111) inclining plane is preferably used.

The thickness of the Si substrate 800 is not limited to a specific value and is preferably greater than or equal to 50 µm but smaller than or equal to 500 µm, more preferably greater than or equal to 100 μm but smaller than or equal to 300 μm. The photoelectric conversion efficiency and mechanical characteristics of the solar cell 80 can thus both be satisfied. Further, the thickness that falls within one of the ranges described above can contribute to reduction in thickness of the electronic timepiece 200.

Passivation Film

The solar cell 80 further includes a passivation film 817 (inorganic film) provided on the light receiving surface 84, as shown in FIG. 9A. Providing the passivation film 817 can prevent a minority carrier produced by light reception from disappearing at the light receiving surface 84.

The passivation film 817 is made of an inorganic material. Examples of the inorganic material may include a silicon oxide, a silicon nitride, a silicon oxynitride, or any other silicon compound, a niobium oxide, a titanium oxide, a tantalum oxide, an aluminum oxide, a zirconium oxide, a lanthanum oxide, or any other metal oxide, a magnesium fluoride, a calcium fluoride, a barium fluoride, a lithium fluoride, a sodium fluoride, and a lanthanum fluoride, or any other fluoride, and a composite material containing one of or two or more of the materials described above.

The passivation film 817 transmits light. Therefore, the passivation film 817, when the refractive index thereof is adjusted as appropriate, also functions as an antireflection film. Adding the function as an antireflection film as described above allows an increase in the amount of light incident on the Si substrate 800 via the light receiving surface 84 to increase the photoelectric conversion efficiency.

Further, the passivation film 817 (inorganic film) preferably contains a silicon compound or a metal oxide. Such a material excels particularly in light transmission and light resistance and is therefore particularly useful in forming the passivation film 817.

On the other hand, since the antireflection effect provided by the passivation film 817 is based on optical interference that occurs in the passivation film 817, the wavelength range over which the effect is provided is affected by the refractive index, the film thickness, and other factors of the passivation film 817. The passivation film 817 therefore provides an effect of lowering the reflectance of light that belongs to a specific wavelength range but cannot sufficiently lower the reflectance of light that belongs to the other wavelength range. As a result, light that belongs to the wavelength range over which the reflectance cannot be lowered forms reflected light, and the color of the reflected light is recognized by an observer.

The passivation film 817 may instead be formed of a plurality of layers made of materials different from one another. The wavelength range over which the antireflection effect is provided can thus be widened, whereby the light incidence efficiency can be increased over a wider wavelength range. As a result, if the reflectance can be lowered over the entire wavelength range, the observer can recognize a color close to black. In many cases, however, it is difficult to achieve complete black, and the absorptance rather undesirably increases in some cases. The number of stacked layers is therefore set in consideration of the facts described above.

From the reason described above, in the observation of the light reflected off the passivation film 817, the wavelength, that is, the color of the reflected light is determined in accordance with the configuration of the passivation film 817, and the observer recognizes the specific color.

In the cell 80a shown in FIG. 8, the film thickness of the passivation film 817 provided on the light receiving surface 84 is so set as to partially vary. As a result, in the cell 80a shown in FIG. 8, letters are placed on the light receiving surface 84. In other words, a pattern that causes a change in recognizable color of the reflected light is placed in the form of letters on the light receiving surface 84.

Specifically, a texture structure, such as that described above, is formed along the light receiving surface 84 according to the present embodiment but is not formed across the entire surface, and the texture structure is so partially formed that the light receiving surface 84 has portions where the texture structure is formed, that is, rough surface sections 841 and portions where no texture structure is formed, that is, smooth sections 842, as shown in FIG. 9A. The surface roughness of the rough surface sections 841 is therefore greater than the surface roughness of the smooth sections 842.

When the passivation film 817 is so provided as to overlap with the rough surface sections 841 and the smooth sections 842, the film thickness t1 of the portions of the passivation film 817 where the passivation film 817 overlaps with the rough surface sections 841 is smaller than the film thickness t2 of the portions of the passivation film 817 where the passivation film 817 overlaps with the smooth sections 842, as shown in FIG. 9A. That is, the passivation film 817 includes thick film sections 8172 having the film thickness t2 and thin film sections 8171 having the film thickness t1, which is smaller than the film thickness t2. The observer who observes the light receiving surface 84 on which the thus configured passivation film 817 is deposited recognizes that the thin film sections 8171 and the thick film sections 8172 have different colors. That is, since the thin film sections 8171 and the thick film sections 8172 attenuate light having different wavelengths in the optical interference process, the observed colors of the reflected light differ from each other.

Therefore, when the rough surface sections 841 and the smooth sections 842 are so patterned, for example, that the rough surface sections 841 form the background and the smooth sections 842 form letters, a figure, a pattern, or any other object (hereinafter abbreviated as "letters or the like"), the observer can recognize the presence of the letters or the like because the letters or the like differ from the background in terms of color. That is, according to the present embodiment, the letters or the like can be placed on the light receiving surface 84 with no use of paint or any other material. The stylish design of the electronic timepiece 200 can therefore be enhanced with the photoelectric conversion efficiency of the cell 80a increased.

The color of the letters or the like and the color of the background described above in the observation of the light receiving surface 84 are primarily determined by the refractive indices and the film thicknesses of the thin film sections 8171 and the thick film sections 8172. The refractive indices are determined by the constituent materials of the passivation film 817. Forming the thin film sections 8171 and the thick film sections 8172 with different materials therefore allows the refractive indices thereof to differ from each other, whereby the color of the letters or the like and the color of the background can be controlled in accordance with the refractive indices.

On the other hand, using different constituent materials tends to cause a complicated manufacturing method and therefore increase the manufacturing cost. To avoid the problem described above, the same constituent material is used, but different film thicknesses are employed in the present embodiment. The film thicknesses t1 and t2 are then adjusted to control the color of the letters or the like and the color of the background.

The difference between the film thickness t1 and the film thickness t2 may be achieved by changing the amount of supplied raw material when the passivation film 817 is deposited or may instead be achieved by changing the surface roughness of the undercoat of the passivation film 817, that is, by causing the surface roughness of the rough surface sections 841 to differ from that of the smooth sections 842. As a result, since mere deposition of the passivation film 817 allows a difference between the film thickness t1 and the film thickness t2, the manufacturing method can be simplified.

As described above, the cell 80a (photoelectric converter) according to the present embodiment includes the crystalline Si substrate 800, which has the light receiving surface 84 including the smooth sections 842 and the rough surface sections 841 having surface roughness greater than that of the smooth sections 842, and the passivation film 817 (inorganic film), which is so provided as to overlap with the smooth sections 842 and the rough surface sections 841 and transmits light, and the film thickness t1 of the portions of the passivation film 817 where the passivation film 817 overlaps with the rough surface sections 841, that is, the film thickness t1 of the thin film sections 8171 is smaller than the film thickness t2 of the portions of the passivation film 817 where the passivation film 817 overlaps with the smooth sections 842, that is, the film thickness t2 of the thick film sections 8172.

According to the thus configured cell 80a, setting the pattern of the rough surface sections 841 and the pattern of the smooth sections 842 as appropriate allows the letters or the like to be placed on the light receiving surface 84 with no use of paint or any other material. As a result, a cell 80a having high photoelectric conversion efficiency and good stylish design can be achieved.

The letters or the like placed on the light receiving surface 84 are recognized by the observer based on the difference in color between the letters or the like and the background, as described above. The "color" in the present specification is a concept including the chromaticity, which is formed of the hue and the saturation, and the lightness. When at least one of the elements described above of a color, the hue, saturation, and the lightness, differs from the element of another color, the colors differ from each other. Therefore, for example, in a case where colors have the same chromaticity but differ from each other in terms of lightness, or in a case where colors have the same lightness but differ from each other in terms of chromaticity, the colors differ from each other.

In the present embodiment, not only do the film thickness t1 and the film thickness t2 differ from each other, but the surface roughness of the rough surface sections 841 differs from that of the smooth sections 842. In the latter case, a difference in texture, such as a difference between a mat finish and a mirror finish, can be added. The letters or the like can thus be recognized not only based merely on a difference in color but based on a difference in texture, whereby the latter contributes to enhancement of stylish design of the electronic timepiece 200.

The difference between the film thickness t1 and the film thickness t2 described above is set as appropriate in accordance with the color of the letters or the like and the color of the background, as described above. As an example of the setting, the film thickness t1 is preferably so set as to be greater than or equal to 40% of the film thickness t2 but smaller than or equal to 95% thereof, more preferably greater than or equal to 50% of the film thickness t2 but smaller than or equal to 85% thereof. The difference in chromaticity or lightness between the light reflected from the thin film sections 8171 and the light reflected from the thick film sections 8172 can thus be sufficiently increased. In particular, a difference in film thickness can provide a difference in chromaticity. The difference in chromaticity between the letters or the like and the background can therefore be sufficiently increased, whereby letters or the like having higher contrast and visibility can be formed.

The film thickness t2 is not limited to a specific value and is preferably greater than or equal to 10 nm but smaller than or equal to 200 nm, more preferably greater than or equal to 20 nm but smaller than or equal to 150 nm, still more preferably greater than or equal to 30 nm but smaller than or equal to 120 nm. When the film thickness t2 falls within any of the ranges described above, the reflectance of visible light can be sufficiently lowered. A sufficient difference in chromaticity can therefore be readily provided with the light incidence efficiency increased. As a result, letters or the like having higher visibility can be formed.

The film thicknesses t1 and t2 can be determined, for example, by observing a cross section of the cell 80a under an electron microscope or any other instrument and averaging the thicknesses of the thin film sections 8171 and the thick film sections 8172, respectively, over a width of 100 µm.

The arithmetic average roughness Ra of the rough surface sections 841 is preferably greater than or equal to 0.1 µm, more preferably greater than or equal to 0.2 µm but smaller than or equal to 0.4 µm. Setting the arithmetic average roughness Ra of the rough surface sections 841 to fall within one of the ranges described above allows the rough surface sections 841 to be provided with a sufficiently effective texture structure. That is, since an irregular shape having a necessary and sufficient height is provided, sufficient multiple reflection is allowed to occur on the light receiving surface 84, whereby the reflectance can be sufficiently lowered.

The arithmetic average roughness Ra may be greater than the upper limit described above. In this case, however, it takes a long time to form the rough surface sections 841. Further, reflectance unevenness could also occur, and a nonuniform color could therefore be observed.

FIG. 9B shows the relationship of the magnitude of the arithmetic average roughness Ra of the rough surface sections 841 with electron microscope images of the rough surface sections 841 in the plan view and conceptual cross sections thereof.

In a case where the arithmetic average roughness Ra of the rough surface sections 841 is greater than or equal to 0.1 µm but smaller than 0.2 µm, the texture structure is formed, but the height of the irregularities is somewhat small, as shown in FIG. 9B.

In contrast, in a case where the arithmetic average roughness Ra of the rough surface sections 841 is greater than or equal to 0.2 µm but smaller than or equal to 0.4 µm, a texture structure having sufficient-height irregularities is formed, and the irregularities are likely to have a uniform height, as shown in the electron microscope image and the conceptual cross section. A uniform color of the reflected light is therefore likely to be achieved.

In a case where the arithmetic average roughness Ra of the rough surface sections 841 is greater than 0.4 µm, the irregularities are likely to have nonuniform heights, as shown in the conceptual cross section. The reason for this is that not only the top layer of the Si substrate 800 but the inner layers thereof contribute to the formation of the texture structure, and that the irregularities are likely to have non-uniform heights in accordance with the degree of the contribution. The reflected light could therefore have color unevenness.

The difference between the arithmetic average roughness Ra of the rough surface sections 841 and the arithmetic average roughness Ra of the smooth sections 842 is preferably greater than or equal to 0.01 µm, more preferably greater than or equal to 0.1 µm, still more preferably greater than or equal to 0.2 µm but smaller than or equal to 0.4 µm. Setting the difference in the arithmetic average roughness Ra to fall within any of the ranges described above allows the difference between the film thicknesses t1 and t2 to be wide enough to fall within any of the ranges described above. As a result, letters or the like having higher visibility can be formed.

The arithmetic average roughness Ra of the rough surface sections 841 is measured in accordance with the method specified in JIS R 1683:2007. An apparatus for measuring the arithmetic average roughness Ra is, for example, a scanning probe microscope (SPM) or any other analyzer, and the measurement range is, for example, 5 micrometers square.

FIG. 9C shows the relationship of the difference in the arithmetic average roughness Ra between the rough surface sections 841 and the smooth sections 842 with the visibility of the letters or the like and the formability of each of the rough surface sections 841 and the smooth sections 842. In the following description, the difference in the arithmetic average roughness Ra between the rough surface sections 841 and the smooth sections 842 is abbreviated to the "difference in surface roughness." FIG. 9C shows scores of evaluation of the visibility and the formability described above in the form of four levels in the order of descending scores, excellent, good, fair, and poor.

In a case where the difference in surface roughness is smaller than 0.01 µm, the visibility and the formability both have as the poor evaluation score, as shown in FIG. 9C. On the other hand, in a case where the difference in surface roughness is greater than or equal to 0.01 µm, the evaluation scores are fair or good, and in a case where the difference in surface roughness is greater than or equal to 0.1 µm but smaller than or equal to 0.4 µm, the visibility and the formability both have the excellent evaluation score.

On the other hand, the arithmetic average roughness Ra of the smooth sections 842 is not limited to a specific value and is preferably smaller than 0.1 µm, more preferably smaller than or equal to 0.01 µm. Setting the arithmetic average roughness Ra of the smooth sections 842 to fall within any of the ranges described above allows, for example, a surface of an Si wafer to be directly used as the smooth sections 842. The smooth sections 842 can therefore be readily manufactured. Since the smooth sections 842 are regions where uniform reflection occurs at the interface between the smooth sections 842 and the passivation film 817, the contrast between the rough surface sections 841 and the smooth sections 842 further increases, whereby letters or the like having higher visibility can be formed.

In the present embodiment, the regions where no irregular shape, such as the texture structure, is formed are used as the smooth sections 842, but not necessarily in the present disclosure, and a minutely irregular shape that falls within the surface roughness range described above may be formed.

The rough surface sections 841 may each have regions where the surface roughness changes stepwise from one to the other. That is, the rough surface sections 841 may each have a region where the surface roughness is relatively large and a region where the surface roughness is smaller than the large surface roughness. The light receiving surface 84 therefore has regions having at least three kinds of surface roughness substantially different from one another in conjunction with the smooth sections 842, and the passivation film 817 also accordingly has regions having at least three film thicknesses different from one another. As a result, at least three regions that produce reflected light having colors different from one another can be disposed.

The area of each of the rough surface sections 841 in the cell 80*a* may be smaller than the area of each of the smooth sections 842 in the cell 80*a* but is preferably greater than the area of each of the smooth sections 842. In the latter case, the rough surface sections 841 each having the texture structure can be so set along the light receiving surface 84 as to be dominant regions. Since the antireflection effect based on the texture structure can therefore be increased, letters or the like having high visibility can be placed on the light receiving surface 84 with the amount of light incident on the Si substrate 800 sufficiently increased. In this case, the total area of the rough surface sections 841 in the cell 80*a* is preferably greater than or equal to 101% of the total area of the smooth sections 842 in the cell 80*a*, more preferably greater than or equal to 200% thereof, still more preferably greater than or equal to 300% thereof.

The area of the rough surface sections 841 in the cell 80*a* is preferably greater than or equal to 50% of the total area of the light receiving surface 84 in the cell 80*a*, more preferably greater than or equal to 70% thereof, still more preferably greater than or equal to 90% thereof. Setting the area of the rough surface sections 841 to fall within any of the ranges described above can ensure a sufficient amount of light incident on the Si substrate 800 and increase the photoelectric conversion efficiency.

On the other hand, the cell 80*a* includes the passivation film 806 provided on the electrode surfaces 85. Providing the passivation film 806 can achieve insulation of each portion and prevent the minority carrier produced by the light reception disappearing at the electrode surfaces 85.

The space between the finger electrodes 804 and the Si substrate 800 and the space between the bus bar electrode 805 and the finger electrode 804 are each insulated from each other via an inter-layer insulation film 807.

The passivation film 806 and the inter-layer insulation films 807 are made, for example, of a silicon oxide, a silicon nitride, a silicon oxynitride, or a silicon aluminum.

Electrodes and Electrode Pads (Connectors)

Figure 10:
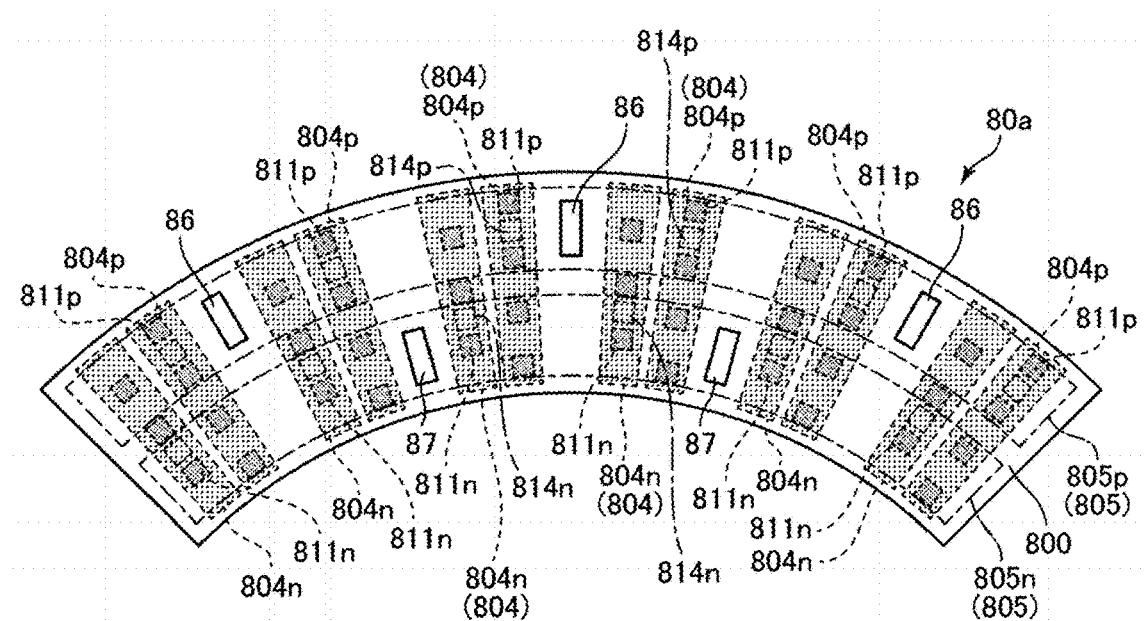
FIG. 10 is a plan view showing an electrode surface of the photoelectric converter shown in FIG. 6.

FIG. 10 is a plan view showing the electrode surface 85 of the cell 80*a* shown in FIG. 6. FIG. 10 shows the finger electrodes 804 covered with the passivation film 806 and the bus bar electrode 805 described above but viewed therethrough. Further, FIG. 10 shows only the contour of the bus bar electrode 805 with the dashed line.

Figure 11:
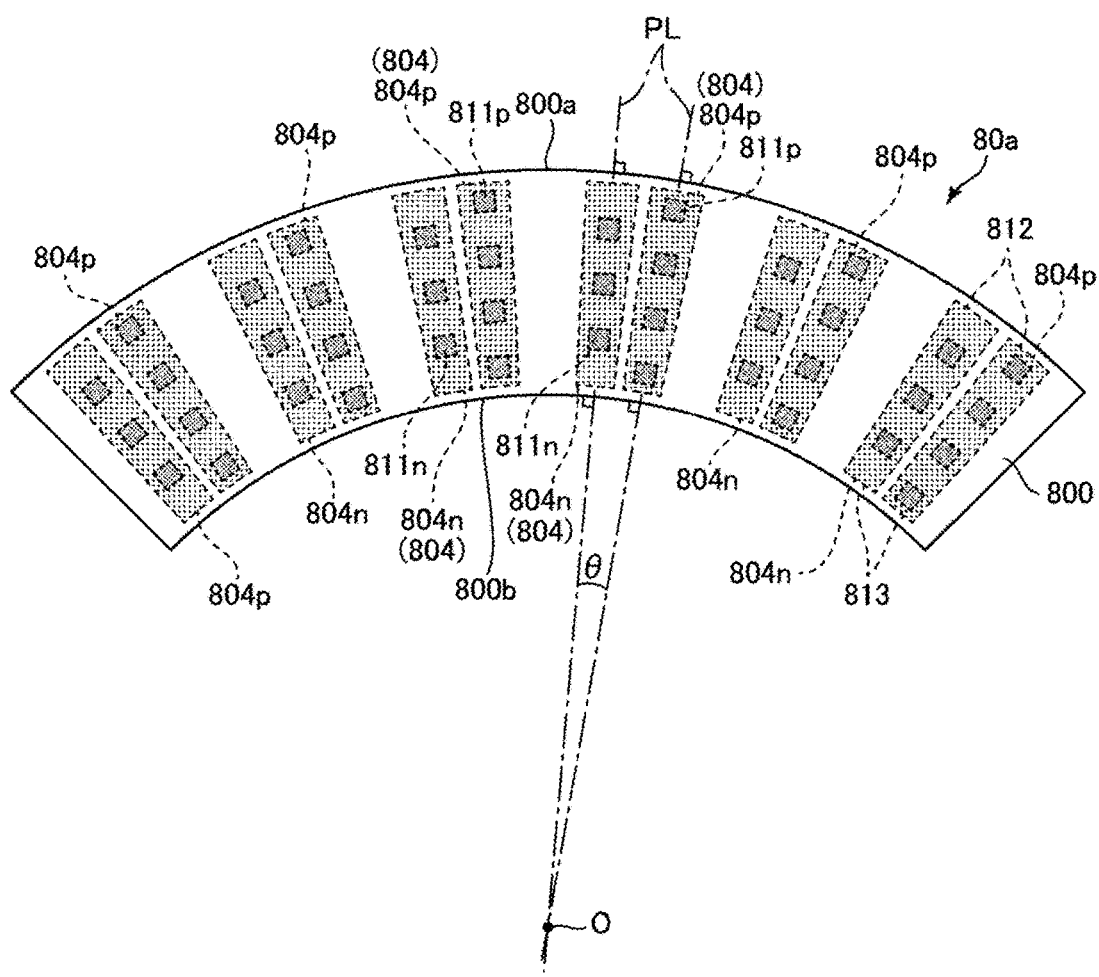
FIG. 11 selectively shows finger electrodes out of the components in the plan view shown in FIG. 10.
Figure 12:
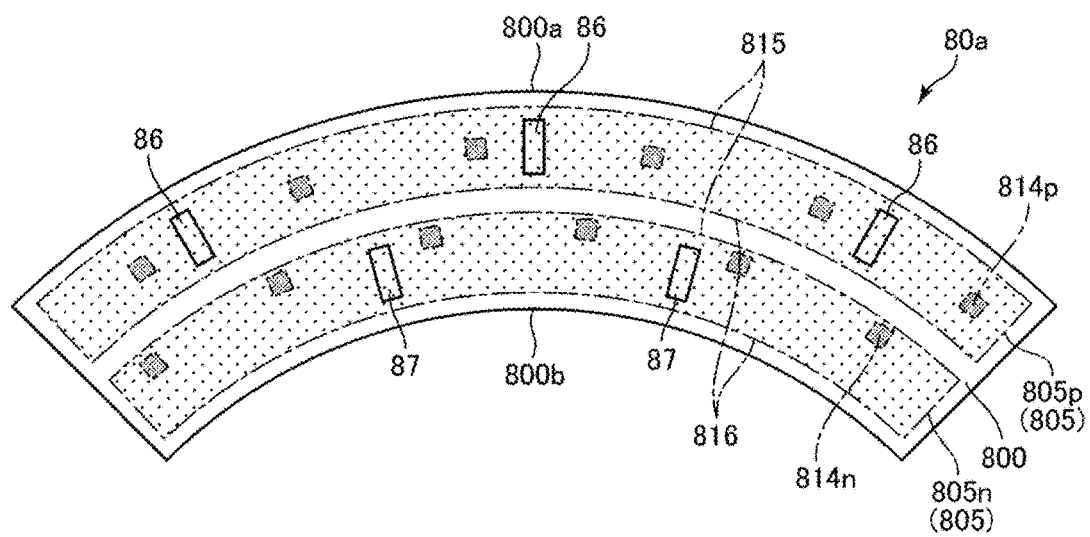
FIG. 12 selectively shows a bus bar electrode and electrode pads out of the components in the plan view shown in FIG. 10.

FIG. 11 selectively shows the finger electrodes 804 out of the components in the plan view shown in FIG. 10, and FIG. 12 selectively shows the bus bar electrode 805 and the electrode pads 86 and 87 out of the components in the plan view shown in FIG. 10. The finger electrodes 804 and the bus bar electrode 805, which are disposed in different layers, are shown on a layer basis in FIGS. 11 and 12.

The following description will be made of the cell 80*a* as a representative example, and the same description holds true for the cells 80*b*, 80*c*, and 80*d*.

The cell 80*a* includes the Si substrate 800, as shown in FIGS. 10 to 12. The contour of the Si substrate 800 has two arcs. The arc corresponding to part of the outer edge of the ring shown in FIG. 5 is a substrate outer edge 800*a*, and the arc corresponding to part of the inner edge of the ring is a substrate inner edge 800*b*.

The cell 80*a* shown in FIGS. 10 to 12 includes p-type finger electrodes 804*p*, which are so provided as to cover the p+ impurity regions 801 (first conductivity type impurity regions) formed on the Si substrate 800 and shown in FIG. 7, and p+ contacts 811*p*, which electrically connect the p+ impurity regions 801 and the p-type finger electrodes 804*p* to each other.

The cell 80*a* shown in FIGS. 10 to 12 includes n-type finger electrodes 804*n*, which are so provided as to cover the n+ impurity regions 802 (second conductivity type impurity regions) formed on the Si substrate 800 and shown in FIG. 7, and n+ contacts 811*n*, which electrically connect the n+ impurity regions 802 and the n-type finger electrodes 804*n* to each other.

A plurality of p+ contacts 811*p* are provided for each of the p-type finger electrodes 804*p*. The p+ impurity regions 801 shown in FIG. 7 are therefore so accordingly configured that a plurality of p+ impurity regions 801 are provided for each of the p-type finger electrodes 804*p*. Holes (carrier) produced by the light reception can therefore be efficiently extracted.

Similarly, a plurality of n+ contacts 811*n* are provided for each of the n-type finger electrodes 804*n*. The n+ impurity regions 802 shown in FIG. 7 are therefore so accordingly configured that a plurality of n+ impurity regions 802 are provided for each of the n-type finger electrodes 804*n*. Electrons (carrier) produced by the light reception can therefore be efficiently extracted.

The material of which the p+ contacts 811*p* and the n+ contacts 811*n* are made is selected as appropriate, for example, from the above-mentioned materials any of which the finger electrodes 804 are made of.

The finger electrodes 804 described above refer both to the p-type finger electrodes 804*p* and the n-type finger electrodes 804*n*.

In FIGS. 10 and 11, the p+ contacts 811*p* and the n+ contacts 811*n* are relatively densely dotted, and the finger electrodes 804 are relatively sparsely dotted.

Further, in FIG. 10, the portion covered with the passivation film 806 is indicated with the broken or chain lines, and the portion exposed from the passivation film 806 is indicated with the solid lines.

A p-type bus bar electrode 805*p* and an n-type bus bar electrode 805*n* are each covered with the passivation film 806, as shown in FIG. 10. The electrodes are thus protected from the external environment.

Electrode Pads (Connectors)

On the other hand, via holes are provided in part of the passivation film 806, and part of the p-type bus bar electrode 805*p* and the n-type bus bar electrode 805*n* is exposed via the via holes. The exposed surfaces of the p-type bus bar electrode 805*p* form the electrode pads 86 (positive electrodes of connectors) described above, and the exposed surfaces of the n-type bus bar electrode 805*n* form the electrode pads 87 (negative electrodes of connectors) described above. That is, the exposed surfaces of the p-type bus bar electrode 805*p*, which are part of the p-type bus bar electrode 805*p* and exposed via the corresponding via holes provided in the passivation film 806, are called the electrode pads 86. Similarly, the exposed surfaces of the n-type bus bar electrode 805*n*, which are part of the n-type bus bar electrode 805*n* and exposed via the corresponding via holes provided in the passivation film 806, are called the electrode pads 87.

The cell 80*a* according to the present embodiment includes a plurality of electrode pads 86 and 87, as shown in FIG. 12.

The plurality of electrode pads 86 are arranged along the substrate outer edge 800*a*, as shown in FIGS. 10 and 12. That is, the axis along which the electrode pads 86 are arranged is substantially parallel to the substrate outer edge 800*a*. On the other hand, the plurality of electrode pads 87 are arranged along the substrate inner edge 800*b*. That is, the axis along which the electrode pads 87 are arranged is substantially parallel to the substrate inner edge 800*b*. The arrangement described above allows points where the electrode pads are connected to the wiring substrate 82 to be provided along the direction in which the cell 80*a* extends (circumferential direction of arc that is part of substrate outer edge 800*a*). Therefore, the cell 80*a* can be more reliably fixed to the wiring substrate 82, and the connection resistance between the cell 80*a* and the wiring substrate 82 can be sufficiently lowered.

The cell 80*a* includes the plurality of finger electrodes 804 as described above, and the number of the finger electrodes 804 is not limited to a specific number and is set as appropriate in accordance with the sizes of the Si substrate 800 and the finger electrodes 804, the interval between the finger electrodes 804, and other factors.

Figure 13:
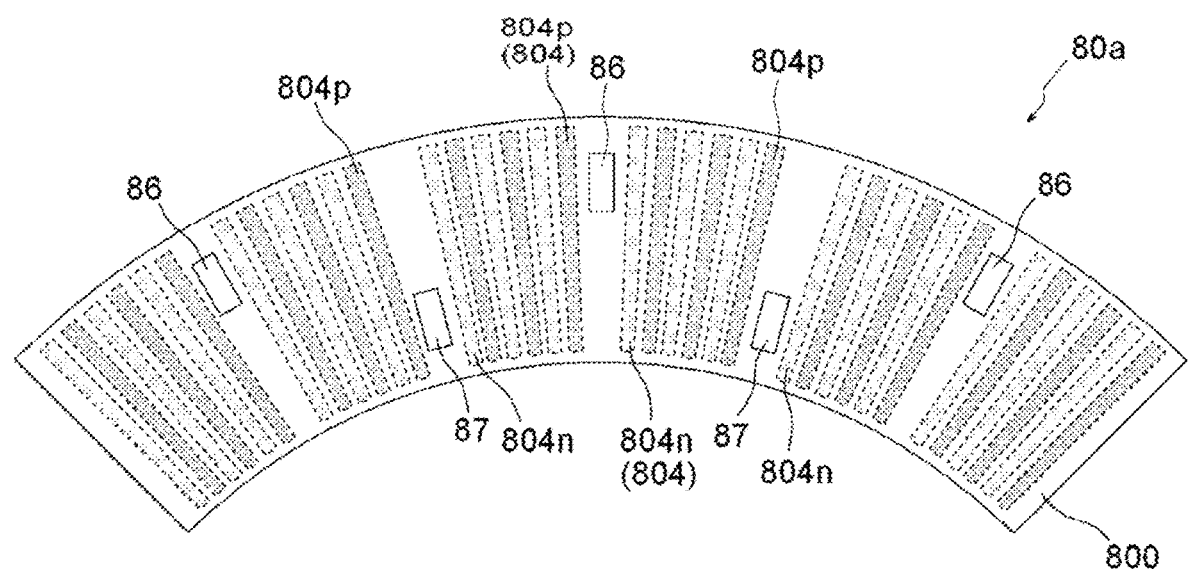
FIG. 13 is a plan view showing a variation of the photoelectric converter shown in FIG. 10 and shows a case in which the number of finger electrodes differs from the number in FIG. 10.

FIG. 13 is a plan view showing a variation of the photoelectric converter shown in FIG. 10 and shows a case in which the number of finger electrodes 804 differs from the number in FIG. 10. In FIG. 13, part of the components of the cell 80*a*, that is, portions excluding the Si substrate 800, the finger electrodes 804, and the electrode pads 86 and 87 are omitted. In FIG. 13, the p-type finger electrodes 804*p* are densely dotted, and the n-type finger electrodes 804*n* are sparsely dotted.

Increasing the number of finger electrodes 804, that is, increasing the density at which the p+ impurity regions 801 and the n+ impurity regions 802 are disposed as described above allows the photoelectric conversion efficiency of the cell 80*a* to be readily increased.

FIG. 13 shows a pattern in which the p-type finger electrodes 804*p* and the n-type finger electrodes 804*n* are alternately arranged in the direction in which the finger electrodes 804 are arranged.

Further, on the opposite sides that sandwich each of the electrode pads 86 and 87, a p-type finger electrode 804*p* and an n-type finger electrode 804*n* face each other with the electrode pad 86 or 87 sandwiched therebetween, as described above. That is, in FIG. 13, the impurity regions located on opposite sides of the electrode pad 86 or 87 in the direction of the minor axis thereof are impurity regions having polarities different from each other, as in FIG. 10.

The p+ impurity regions 801 are connected to the electrode pads 86 via the p-type finger electrodes 804*p* and p-type bus bar electrode 805*p*, and the n+ impurity regions 802 are connected to the electrode pads 87 via the n-type finger electrodes 804*n* and n-type bus bar electrode 805*n*.

The shape of the Si substrate 800 in the plan view is not limited to the shape described above and may be any shape, for example, an oblong shape, a square shape, or any other quadrangular shape, a hexagonal shape, an octagonal shape, or any other polygonal shape, a perfectly circular shape, an elliptical shape, an oval shape, or any other circular shape.

In the cell 80*a* according to the present embodiment, the plurality of electrode pads 86 and the plurality of electrode pads 87 are provided, as described above. The arrangement described above causes the conductive connectors 83 joined to the connectors to be arranged in the same manner. The cell 80a is therefore supported by the wiring substrate 82 at multiple points with the positions of the terminals serving as support points. The reduction in connection resistance and the improvement in connection strength can therefore be enhanced.

The area of each of the electrode pads 86 and 87 slightly varies in accordance with the size of the Si substrate 800 and is preferably greater than or equal to 0.05 mm$^2$ but smaller than or equal to 5 mm$^2$, more preferably greater than or equal to 0.1 mm$^2$ but smaller than or equal to 3 mm$^2$. Loss of collected minority carrier due to the provided electrode pads 86 and 87 can be sufficiently suppressed with the reduction in connection resistance and the improvement in connection strength sufficiently enhanced.

The arrangement of the electrode pads 86 and 87 is not limited to the arrangement described above. For example, the positions of the columns of the electrode pads 86 may be swapped with the positions of the columns of the electrode pads 87. That is, the positive-electrode connectors may be disposed on the side facing the substrate inner edge 800b, and the negative-electrode connectors may be disposed on the side facing the substrate outer edge 800a.

The electrode pads 86 and 87 does not necessarily have a specific shape and may have any shape. The electrode pads 86 and 87 shown in FIGS. 12 and 13 each have an oblong shape by way of example and may instead have a perfectly circular shape, an elliptical shape, an oval shape, or any other circular shape, a triangular shape, a hexagonal shape, an octagonal shape, or any other polygonal shape, or any other shape.

It is preferable that the electrode pads 86 have the same shape, so do the electrode pads 87, and so do the electrode pads 86 and 87, but the electrode pads 86 may have different shapes, so may the electrode pads 87, and so may the electrode pads 86 and 87.

The substrate outer edge 800a and the substrate inner edge 800b preferably is formed of concentric arcs. That is, it is preferable that the substrate outer edge 800a is formed of a relatively large-diameter arc and the substrate inner edge 800b is formed of a relatively small-diameter arc that is concentric with the substrate outer edge 800a. In this case, the finger electrodes 804 and the bus bar electrode 805 can be readily designed, and the structural balance of the cell 80a is optimized. As a result, the cell 80a is unlikely to experience warpage or any other deformation.

The substrate outer edge 800a and the substrate inner edge 800b may each be partially or entirely a straight line, may each have a curved line other than the arc, or may have arcs that are not concentric with each other.

In the present embodiment, however, the contour of the Si substrate 800 has the curved lines. The cell 80a therefore contributes to further enhancement of decorative design of the electronic timepiece 200.

Although the curved lines are manufactured as part of a polygonal shape having a large number of corners in some cases due to restraints in manufacturing technologies, the curved lines in the present specification conceptually also include part of such a polygonal shape.

The substrate outer edge 800a is longer than the substrate inner edge 800b. In consideration of this, the number of electrode pads 86 located on the side facing the substrate outer edge 800a is preferably greater than the number of electrode pads 87 located on the side facing the substrate inner edge 80b.

In the present embodiment, the p+ impurity regions 801 (see FIG. 7), the n+ impurity regions 802 (see FIG. 7), the p+ contacts 811p, and the n+ contacts 811n are so disposed in the portion where the electrode pads 86 and 87 are provided that these components do not overlap with each other in the plan view (see FIG. 10).

That is, in the plan view of the principal plane of the Si substrate 800, the electrode pads 86 (connectors) are so disposed as to be shifted from the p+ impurity regions 801 and the n+ impurity regions 802. The electrode pads 86 are therefore naturally so disposed as to be shifted from the p+ contacts 811p and the n+ contacts 811n.

Similarly, in the plan view of the principal plane of the Si substrate 800, the electrode pads 87 (connectors) are so disposed as to be shifted from the p+ impurity regions 801 and the n+ impurity regions 802. The electrode pads 87 are therefore naturally so disposed as to be shifted from the p+ contacts 811p and the n+ contacts 811n.

Therefore, for example, after the conductive connectors 83 are joined to the electrode pads 86 and 87, and even if any of the joined portions is broken, damage of the corresponding p+ impurity region 801 and n+ impurity region 802 can be avoided. The cell 80a can therefore be further reliable.

Further, the arrangement described above prevents the p+ impurity regions 801 and the n+ impurity regions 802 from affecting the electrode pads 86 and 87 in terms of shape, such as the planarity thereof. The electrode pads 86 and 87 therefore have good planarity and are unlikely to experience contact failure.

The arrangement described above is not necessarily employed. For example, the electrode pads 86 and 87 may overlap with any of the p+ impurity regions 801, the n+ impurity regions 802, the p+ contacts 811p, and the n+ contacts 811n in the plan view.

Finger Electrodes

The finger electrodes 804 preferably extend in the direction in which perpendiculars PL to the curved line of the substrate outer edge 800a extend, as shown in FIG. 11. That is, it is preferable that the cell 80a includes the Si substrate 800 having the substrate outer edge 800a having a curved line and the substrate inner edge 800b shifted inward from the substrate outer edge 800a and having a curved line and the plurality of finger electrodes 804 provided on one surface of the Si substrate 800, and that the finger electrodes 804 extend in the direction in which the perpendiculars to the curved line of the substrate outer edge 800a extend. As a result, in a case where the substrate outer edge 800a is an arc, the finger electrodes 804 extend along straight lines radially extending from the center O of the arc.

On the other hand, in the cell 80a according to the present embodiment, the perpendiculars PL described above is also perpendicular to the substrate inner edge 800b.

The perpendiculars PL described above preferably pass through the center O of the arc of the substrate outer edge 800a. That is, the arc is preferably part of a perfect circle or a shape close thereto. In this case, the finger electrodes 804 can be readily designed, and the structural balance of the cell 80a is optimized. As a result, the cell 80a is more unlikely to experience warpage or any other deformation.

The cell 80a is provided with the plurality of finger electrodes 804. The finger electrodes 804 are therefore arranged (line up) along the substrate outer edge 800a. In other words, it can be said that the axis along which the finger electrodes 804 are arranged is substantially parallel to the substrate outer edge 800a. The arrangement described above allows the finger electrodes 804 to have a uniform shape and area, whereby the cell 80a can have a uniform structure. As a result, the cell 80*a* is unlikely to experience warpage or any other deformation. In addition, the finger electrodes 804 can be packed with a smallest possible gap therebetween on the Si substrate 800. The finger electrodes 804 therefore also function as reflection films located on the side facing the electrode surfaces 85 of the Si substrate 800 and reflecting the light incident via the light receiving surface 84. That is, since the finger electrodes 804 are packed with no gap therebetween, the light having been incident via the light receiving surface 84 and having passed through the Si substrate 800 can be reflected off the finger electrodes 804 at high probability. The amount of light that contributes to the photoelectric conversion can therefore be increased, whereby the photoelectric conversion efficiency can be improved.

Further, at least finger electrodes 804 adjacent to each other may differ from each other in terms of shape, area, and other factors but preferably have the same shape and area. The cell 80*a* thus has a further uniform structure.

The same shape and area and the parallelism described above are each a concept that permits errors that occur when the cell 80*a* is manufactured.

In the case where the finger electrodes 804 are arranged along the substrate outer edge 800*a*, it is preferable that the p-type finger electrodes 804*p* and the n-type finger electrodes 804*n* are alternately arranged, but the arrangement pattern is not necessarily employed, and an arrangement pattern partially or entirely different from the arrangement pattern described above may be employed.

The contour of each of the finger electrodes 804 may have any shape. In FIG. 11, the finger electrodes 804 each have a finger electrode outer edge 812, which faces the substrate outer edge 800*a*, and a finger electrode inner edge 813, which faces the substrate inner edge 800*b*. The finger electrode outer edge 812 is longer than the finger electrode inner edge 813. That is, assuming that the length of each of the finger electrodes 804 shown in FIG. 11 in the direction in which the substrate outer edge 800*a* extends is the "width" of the finger electrode 804, the width gradually increases with distance from the finger electrode inner edge 813 toward the finger electrode outer edge 812.

The finger electrodes 804 each having the contour shape described above can be packed with a smallest possible gap therebetween on the Si substrate 800 with the gaps between the finger electrodes 804 fixed. The function of the finger electrodes 804 as the reflection films can therefore be enhanced with the insulation between the finger electrodes 804 ensured.

In the present embodiment, when perpendiculars similar to the perpendiculars PL shown in FIG. 11, are so drawn as to pass through the electrode pads 86 and 87, no p+ impurity regions 801 (see FIG. 7) or n+ impurity regions 802 (see FIG. 7) are provided on the perpendiculars. Further, no finger electrodes 804 are also provided on the perpendiculars accordingly.

In the present embodiment described above, since the structure of the photoelectric converter is relatively readily simple, the manufacturability thereof is high, whereby high manufacturing yield is achieved.

The configuration described above is not necessarily employed. For example, the p+ impurity regions 801 and the n+ impurity regions 802 may be provided on the perpendiculars passing through the electrode pads 86 and 87.

The two perpendiculars PL shown in FIG. 11 pass through the centers of the widths of the two finger electrodes 804 adjacent to each other. The perpendiculars PL pass through the center O of the arc of the substrate outer edge 800*a*, as described above. The angle θ between the two perpendiculars PL corresponds to the interval between the adjacent finger electrodes 804. The angle θ is set as appropriate in accordance with the carrier mobility and other factors in the Si substrate 800 and is preferably greater than or equal to 0.05° but smaller than or equal to 1°, more preferably greater than or equal to 0.1° but smaller than or equal to 0.5° by way of example. Since the interval between the contacts and the interval between the impurity regions provided in correspondence with the finger electrodes 804 are therefore optimized, whereby the efficiency at which the carrier produced by the light reception is extracted is improved. As a result, the cell 80*a* has particularly high photoelectric conversion efficiency.

The width of each of the finger electrodes 804 is preferably greater than or equal to 5 μm but smaller than or equal to 100 μm, more preferably greater than or equal to 10 μm but smaller than or equal to 50 μm from the same point of view described above.

On the other hand, the interval between the finger electrodes 804 is preferably greater than or equal to 1 μm but smaller than or equal to 50 μm, more preferably greater than or equal to 3 μm but smaller than or equal to 30 μm. The area occupied by the finger electrodes 804 can thus be sufficiently large with the insulation between the finger electrodes 804 provided.

Bus Bar Electrode

On the other hand, the cell 80*a* includes the p-type bus bar electrode 805*p* and n-type bus bar electrode 805*n*, which traverse the plurality of finger electrodes 804 and cover the finger electrodes 804, as shown in FIGS. 10 and 12. The p-type bus bar electrode 805*p* is electrically connected to the plurality of p-type finger electrodes 804*p* via p-type via wiring lines 814*p*, and the n-type bus bar electrode 805*n* is electrically connected to the plurality of n-type finger electrodes 804*n* via n-type via wiring lines 814*n*.

A plurality of p-type via wiring lines 814*p* are provided for each of the p-type bus bar electrodes 805*p*. Similarly, a plurality of n-type via wiring lines 814*n* are provided for each of the n-type bus bar electrodes 805*n*.

The material of which the p-type via wiring lines 814*p* and the n-type via wiring lines 814*n* are made is selected as appropriate, for example, from the above-mentioned materials any of which the bus bar electrode 805 is made of.

The bus bar electrode 805 described above refers both to the p-type bus bar electrode 805*p* and the n-type bus bar electrode 805*n*.

In FIG. 12, the p-type via wiring line 814*p* and the n-type via wiring line 814*n* are relatively densely dotted, and the bus bar electrode 805 is relatively sparsely dotted.

The direction in which the bus bar electrode 805 extends intersects the direction in which the finger electrodes 804 extend, as shown in FIGS. 10 and 12. That is, the finger electrodes 804 extend in the directions of perpendiculars to the substrate outer edge 800*a*, as described above, whereas the bus bar electrode 805 extends in the direction parallel to the substrate outer edge 800*a*. Therefore, in the plan view of the Si substrate 800, the finger electrodes 804 and the bus bar electrode 805 are substantially perpendicular to each other, as shown in FIG. 10. The bus bar electrode 805 is therefore so disposed as to traverse the plurality of finger electrodes 804, whereby the bus bar electrode 805 serves as an effective electrical collector in a case where the p-type via wiring lines 814*p* or the n-type via wiring lines 814*n* are disposed at the intersections of the finger electrodes 804 and the bus bar electrode 805.

The term "parallel direction" refers to the state in which the bus bar electrode 805 is displaced from the substrate outer edge 800a with a substantially fixed distance therebetween maintained. The phrase "with a fixed distance maintained" refers to the state in which the width of a change in the separation distance between the bus bar electrode 805 and the substrate outer edge 800a is smaller than or equal to 100% of a maximum separation distance (preferably smaller than or equal to 10% of average separation distance) over the overall length of the bus bar electrode 805.

The angle between the finger electrodes 804 and the bus bar electrode 805, which intersect each other, is not limited to 90°, and the smaller intersection angle may be greater than or equal to about 30° but smaller than about 90°. The bus bar electrode 805 is not necessarily parallel to the substrate outer edge 800a and may linearly extend.

The bus bar electrode 805 according to the present embodiment overlaps with the finger electrodes 804 in the thickness direction of the Si substrate 800, as described above. Therefore, since the placement of the bus bar electrode 805 requires no dedicated space, the space where the finger electrodes 804, the p+ impurity regions 801, and the n+ impurity regions 802 are placed on the Si substrate 800 can be increased. As a result, the number of extractable carriers increases, and the function of the finger electrodes 804 and the bus bar electrode 805 as the reflection films is improved, whereby the photoelectric conversion efficiency can be further increased.

The bus bar electrode 805 is insulated from the finger electrodes 804 via the inter-layer insulating film 807 shown in FIG. 7, whereas the bus bar electrode 805 is electrically connected to the finger electrodes 804 via the p-type via wiring lines 814p and the n-type via wiring lines 814n, which pass through part of the inter-layer insulating film 807.

The positions of the p-type via wiring lines 814p in the plan view of the Si substrate 800 may overlap with the positions of the p+ contacts 811p and are preferably shifted therefrom. Similarly, the positions of the n-type via wiring lines 814n in the plan view of the Si substrate 800 may overlap with the positions of the n+ contacts 811n and are preferably shifted therefrom. As a result, the planarity of the undercoat of the p-type via wiring lines 814p and the n-type via wiring lines 814n increases, whereby shift of the position where the p-type via wiring lines 814p and the n-type via wiring lines 814n are formed, failure of the manufactured p-type via wiring lines 814p and n-type via wiring lines 814n, and other problems are unlikely to occur. A decrease in the yield of the manufactured cell 80a can therefore be suppressed.

The p-type via wiring lines 814p are preferably located between the p+ contacts 811p, and the n-type via wiring lines 814n are preferably located between the n+ contacts 811n.

The contour of the bus bar electrode 805 may have any shape. In FIG. 12, the bus bar electrode 805 has bus bar electrode outer edges 815, which face the substrate outer edge 800a, and bus bar electrode inner edges 816, which face the substrate inner edge 800b. The bus bar electrode outer edge 815 is longer than the bus bar electrode inner edge 816.

The bus bar electrode 805 having the contour shape described above has the same shape as that of the Si substrate 800, that is, the shape of a portion cut from a ring. Therefore, the bus bar electrode 805 is readily caused to intersect the plurality of finger electrodes 804 packed across the Si substrate 800, and the plurality of p-type bus bar electrode 805p and n-type bus bar electrode 805n are readily disposed.

Further, the thus configured bus bar electrode 805 is substantially perpendicular to the finger electrodes 804, as described above. The p-type via wiring lines 814p and the n-type via wiring lines 814n can therefore advantageously be readily disposed at the intersections of the finger electrodes 804 and the bus bar electrode 805.

The situation in which the bus bar electrode outer edges 815 face the substrate outer edge 800a refers to the state in which the bus bar electrode outer edges 815 are displaced from the substrate outer edge 800a with a substantially fixed distance therebetween maintained. The phrase "with a fixed distance maintained" refers to the state in which the width of a change in the separation distance between the bus bar electrode outer edges 815 and the substrate outer edge 800a is smaller than or equal to 100% of a maximum separation distance (preferably smaller than or equal to 10% of average separation distance) over the overall length of the bus bar electrode outer edges 815.

Similarly, the situation in which the bus bar electrode inner edges 816 face the substrate inner edge 800b refers to the state in which the bus bar electrode inner edges 816 are displaced from the substrate inner edge 800b with a substantially fixed distance therebetween maintained. The phrase "with a fixed distance maintained" refers to the state in which the width of a change in the separation distance between the bus bar electrode inner edges 816 and the substrate inner edge 800b is smaller than or equal to 100% of a maximum separation distance (preferably smaller than or equal to 10% of average separation distance) over the overall length of the bus bar electrode inner edges 816.

The finger electrodes 804 and the bus bar electrode 805 may be made, for example, of aluminum, titanium, copper, or any other single-metal material or an alloy of any of the metals.

The cell 80a has been described above as a representative example. The solar cell 80 (photoelectric conversion module) includes the cell 80a (photoelectric converter), the wiring substrate 82, which is so provided as to overlap with the cell 80a, and the conductive connectors 83, which electrically connect the electrode pads 86 and 87 of the cell 80a to the conductive films 822 on the wiring substrate 82. The solar cell 80 therefore not only has good stylish design because the letters or the like are placed on the light receiving surface 84 but has high photoelectric conversion efficiency.

Since the wiring substrate 82 covers at least part of the electrode surfaces 85 of the cell 80a, the electrode surfaces 85 are protected. Adherence of foreign matter to the electrode surfaces 85 and exertion of external force on the electrode surfaces 85 are therefore avoided. As a result, the reliability of the electrode surfaces 85 can be ensured.

In other words, in the plan view of the light receiving surface 84, the conductive connectors 83 are preferably hidden behind the cell 80a (overlap with cell 80a). As a result, the aesthetic exterior appearance of the solar cell 80 can be improved because the conductive connectors 83 are not visually recognized, in addition to the above-mentioned effect of ensuring the reliability. An electronic timepiece 200 having further enhanced decorative design can be achieved.

The conductive connectors 83 are not only electrically but mechanically connected to the cell 80a and the wiring substrate 82. The above-mentioned stress concentration in the cell 80a can therefore be reduced by optimization of the mechanical characteristics of the conductive connectors 83.

Specifically, Young's modulus of the conductive connectors 83 is preferably greater than or equal to 0.5 GPa but smaller than or equal to 15 GPa, more preferably greater than or equal to 1 GPa but smaller than or equal to 10 GPa, still more preferably greater than or equal to 1.5 GPa but smaller than or equal to 6.5 GPa. Setting Young's modulus of the conductive connectors 83 to fall within any of the ranges described above prevents the conductive connectors 83 from being distorted or otherwise deformed with the bonding strength that the conductive connectors 83 need to have ensured. The reliability of the mechanical connection based on the excellent mechanical characteristics and the ability to reduce the stress concentration that occurs in the cell 80*a* can therefore both be achieved.

In a case where Young's modulus of the conductive connectors 83 is smaller than the lower limit described above, the conductive connectors 83 have poor mechanical characteristics, and required bonding strength could not be satisfied depending on the specifications and other factors of the cell 80*a*. On the other hand, in a case where Young's modulus of the conductive connectors 83 is greater than the upper limit described above, the conductive connectors 83 has poor deformability, and the conductive connectors 83 could not therefore sufficiently prevent distortion of the cell 80*a* depending on the specifications and other factors of the cell 80*a*, so that the warpage and any other problem of the cell 80*a* could occur.

Young's modulus of the conductive connectors 83 is measured with a dynamic viscoelasticity measuring apparatus (DMA), for example, at 25° C.

From the above-mentioned viewpoint of Young's modulus, the conductive connectors 83 are preferably formed particularly of a conductive adhesive containing a resin material.

Examples of the resin material contained in the conductive adhesive may include an epoxy-based resin, a urethane-based resin, a silicone-based resin, and an acrylic resin, and one of or two or more of the resin materials described above are mixed with each other for use.

The electronic timepiece 200 (electronic instrument) includes the solar cell 80 including the four cells 80*a*, 80*b*, 80*c*, and 80*d* (photoelectric converters). The electronic timepiece 200 therefore has good stylish design and high photoelectric conversion efficiency.

The solar cell 80 may be incorporated in an analog timepiece in place of the electronic timepiece 200.

Figure 14:
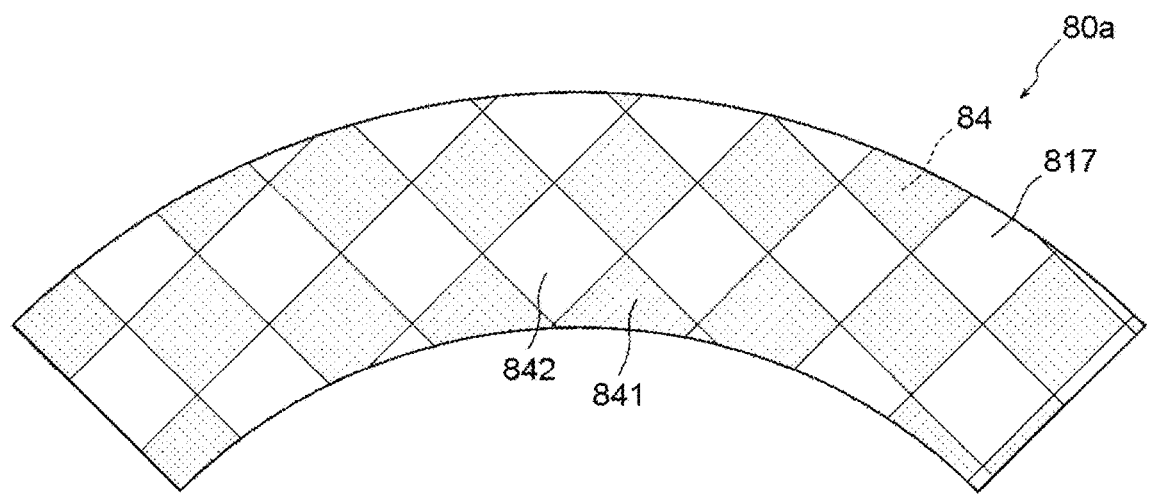
FIG. 14 is a plan view showing a variation of the cell shown in FIG. 8 and shows a case where a pattern is placed in place of the letters.

FIG. 14 is a plan view showing a variation of the cell shown in FIG. 8 and shows a case where a pattern is placed in place of the letters.

In this case, the cell 80*a* includes a passivation film 817 having a square figure formed of the thick film section 8172 and a square figure formed of the thin film section 8171 with the two types of square figure alternately arranged. The observer who views the light receiving surface 84 on which the thus configured passivation film 817 is deposited recognizes different colors and textures provided by the thin film sections 8171 and the thick film sections 8172. As a result, excellent stylish design based on the pattern can be imparted to the cell 80*a*.

Second Embodiment

A solar cell 80 that is a photoelectric conversion module according to a second embodiment of the present disclosure will next be described in detail.

Figure 15:
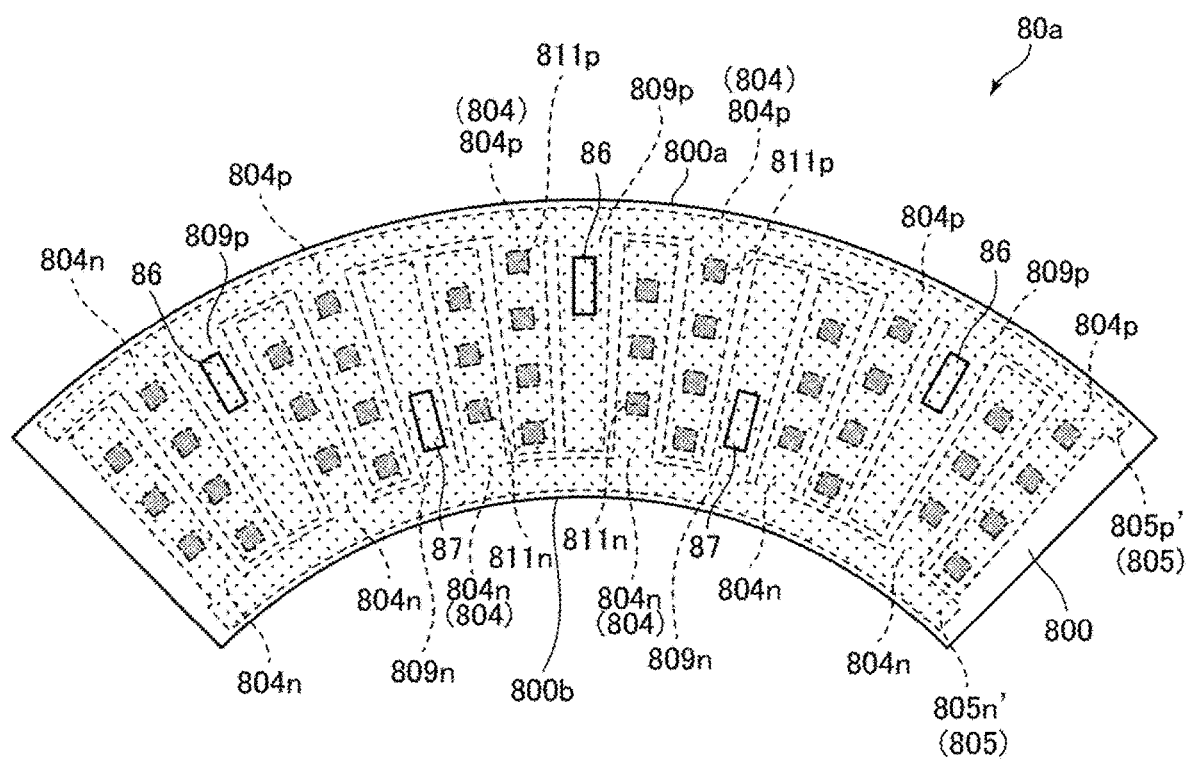
FIG. 15 is a plan view showing a photoelectric conversion module according to a second embodiment.

FIG. 15 is a plan view showing the photoelectric conversion module according to the second embodiment.

The second embodiment will be described below. The following description will be made primarily on differences from the first embodiment, and the same items will not be described. In FIG. 15, the same configurations as those in the first embodiment described above have the same reference characters.

In the first embodiment described above, the finger electrodes 804 and the bus bar electrode 805 are provided in layers different from each other, whereas in the second embodiment, the finger electrodes 804 and the bus bar electrode 805 are provided in the same layer. The other configurations are substantially the same as those in the solar cell 80 according to the first embodiment.

Specifically, a p-type bus bar electrode 805*p'* is located in the same layer where the finger electrodes 804 are located and is disposed in a portion shifted from the finger electrodes 804 toward the substrate outer edge 800*a*.

The p-type finger electrodes 804*p* and the p-type bus bar electrode 805*p'* are connected to each other, whereas the n-type finger electrodes 804*n* and the p-type bus bar electrode 805*p'* are separate and insulated from each other.

On the other hand, an n-type bus bar electrode 805*n'* is located in the same layer where the finger electrodes 804 are located and is disposed in a portion shifted from the finger electrodes 804 toward the substrate inner edge 800*b*.

The n-type finger electrodes 804*n* and the n-type bus bar electrode 805*n'* are connected to each other, whereas the p-type finger electrodes 804*p* and the n-type bus bar electrode 805*n'* are separate and insulated from each other.

The finger electrodes 804 and the bus bar electrode 805 shown in FIG. 15 therefore form what is called comb-tooth-shaped electrodes.

The electrode pads 86 are provided in positions where the electrode pads 86 overlap with branches 809*p*, which branch off the p-type bus bar electrode 805*p'*.

On the other hand, the electrode pads 87 are provided in positions where the electrode pads 87 overlap with branches 809*n*, which branch off the n-type bus bar electrode 805*n'*.

The second embodiment described above allows the finger electrodes 804 and the bus bar electrode 805 to be provided in the same layer, whereby the structure of the solar cell 80 can be simplified and the cost thereof can be lowered.

The second embodiment described above also provides the same effects provided by the first embodiment described above.

Method for Manufacturing Photoelectric Conversion Module

An example of a method for manufacturing the solar cell 80 (photoelectric conversion module) will next be described with reference to FIG. 7.

[1] The cell 80*a* is first prepared. The cell 80*a* is manufactured, for example, by forming the impurity regions and other portions in an Si(100) wafer, then forming the electrodes, contacts, insulating films, and other components in deposition processes, and then dividing the resultant structure into individual pieces. The electrodes, contacts, insulating films, and other components are formed, for example, by a variety of evaporation technologies and photolithography technologies for pattering the films formed by the evaporation technologies.

The passivation film 817 described above is deposited, for example, as follows.

[1-1] A front surface of the Si wafer is first ground. The grinding is finished by performing polish finishing to achieve a mirror-finished surface. A resist film is then deposited on each of the ground surface and the rear surface of the wafer. In this process, the resist film to be formed on the ground surface is deposited only on the regions where the smooth sections 842 are formed. Regions of the ground surface that are the regions where the rough surface sections 841 are formed are therefore exposed via the resist film.

[1-2] The process of removing damage caused by the grinding is next carried out. Wet etching is subsequently performed on the Si wafer. As a result, the texture structure described above is formed in each region of the ground surface that is the region covered with no resist film to form the rough surface sections 841. The resist film is then removed, and the portions from which the resist film is removed form the smooth sections 842. The etching liquid is, for example, an alkali solution or an acid solution. The etching or any other chemical method may be replaced with blasting or any other mechanical method.

[1-3] The passivation film 817 is then deposited on the light receiving surface 84 including the rough surface sections 841 and the smooth sections 842. To deposit the passivation film 817, vapor deposition, for example, CVD and sputtering, is preferably used, but liquid deposition may instead be used.

In a case where the passivation film 817 is deposited with the same amount of raw material per unit area supplied to the rough surface sections 841 and the smooth sections 842, the film thickness of the deposited passivation film 817 varies in accordance with the surface area of the light receiving surface 84, which is the undercoat of the passivation film 817. Since the surface area of each of the rough surface sections 841 is greater than the surface area of each of the smooth sections 842 by the amount corresponding to the formed texture structure although the two sections have the same apparent area, the passivation film 817 deposited on the rough surface sections 841 naturally has a smaller film thickness. That is, the film thickness t1 of the passivation film 817 that overlaps with the rough surface sections 841 is smaller than the film thickness t2 of the passivation film 817 that overlaps with the smooth sections 842. Using the thus achieved film thickness difference allows the passivation film 817 having partially varying film thickness to be efficiently manufactured.

Changing the surface area of each of the rough surface sections 841, that is, changing the inclination angle of the irregularities, the interval between the irregularities, and other factors in the texture structure allows adjustment of the ratio of the film thickness t1 to the film thickness t2.

[2] The electrically conductive connectors 83 are then disposed on at least one of the cell 80a and the openings 824. Specifically, the conductive connectors 83 may be disposed on the electrode pads 86 of the cell 80a, or the conductive connectors 83 may be disposed in the openings 824 of the wiring substrate 82. A metal bump or any other component may be formed in advance on each of the electrode pads 86 and the conductive films 822.

[3] The cell 80a and the wiring substrate 82 are overlaid on each other via the conductive connectors 83 (layering step). The conductive connectors 83 are then each deformed by a load acting thereon and spread in the space inside the corresponding opening 824. As a result, the conductive connectors 83 come into contact with both the electrode pads 86 of the cell 80a and the conductive films 822 on the wiring substrate 82 to allow electrical connection between the electrode pads 86 and the conductive films 822.

The solar cell 80 is thus provided.

The manufacturing method described above is an example, and each of the steps may be replaced with a different step. For example, the polish finishing may be performed only on the regions where the smooth sections 842 are formed, and no polish finishing may be performed on the regions where the rough surface sections 841 are formed. The method described above can also form the rough surface sections 841 and the smooth sections 842.

Variation of Electronic Timepiece

A variation of the electronic timepiece that is the electronic instrument according to the embodiment of the present disclosure will next be described. The variation relates to what is called an analog electronic timepiece and is so configured that the solar cell (photoelectric conversion module) disposed on the side facing the rear surface of the dial generates power (photoelectric conversion) and the power produced by the power generation is used as driving power.

Figure 16:
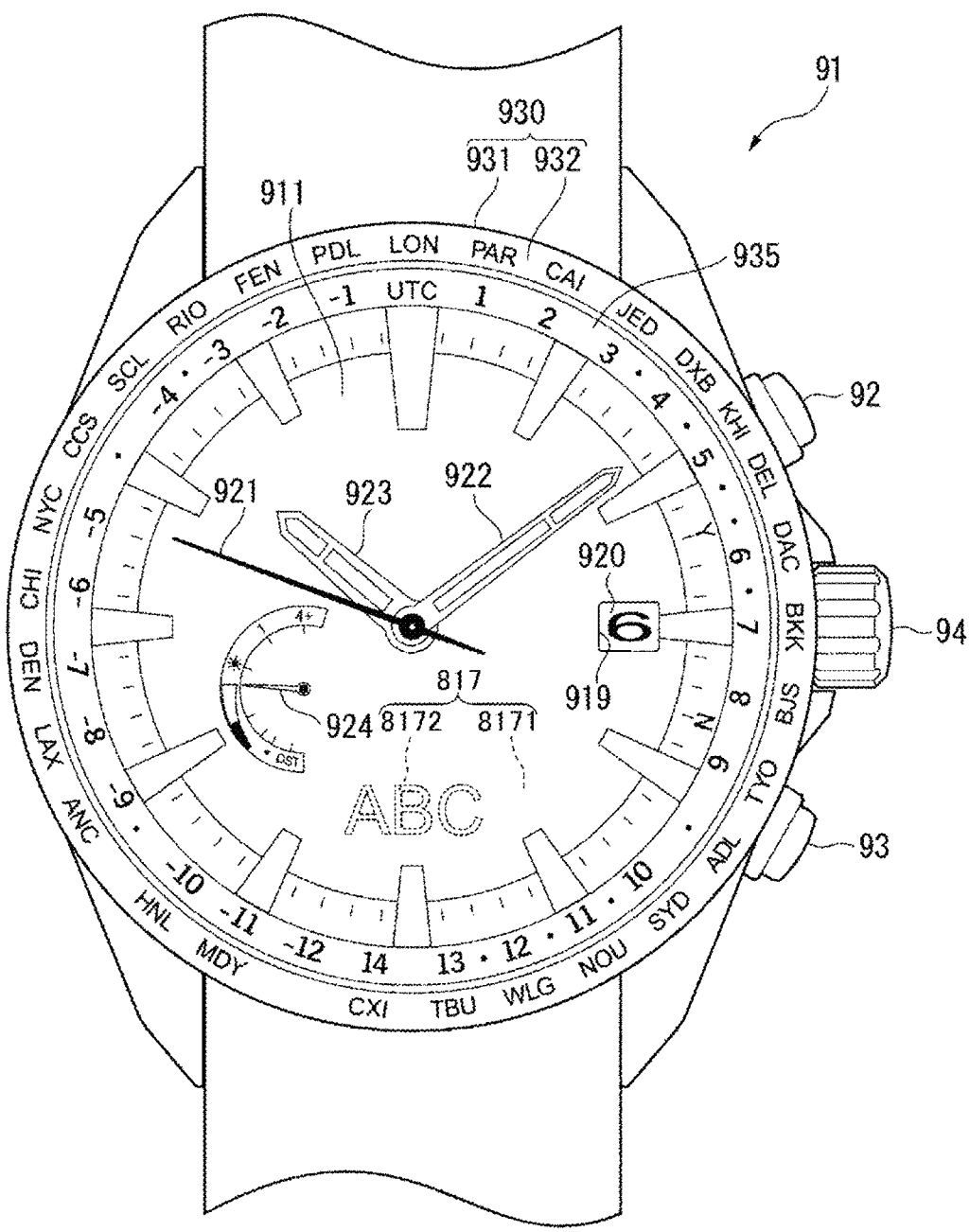
FIG. 16 is a plan view showing a variation of the electronic timepiece that is the electronic instrument according to the embodiment of the present disclosure.
Figure 17:
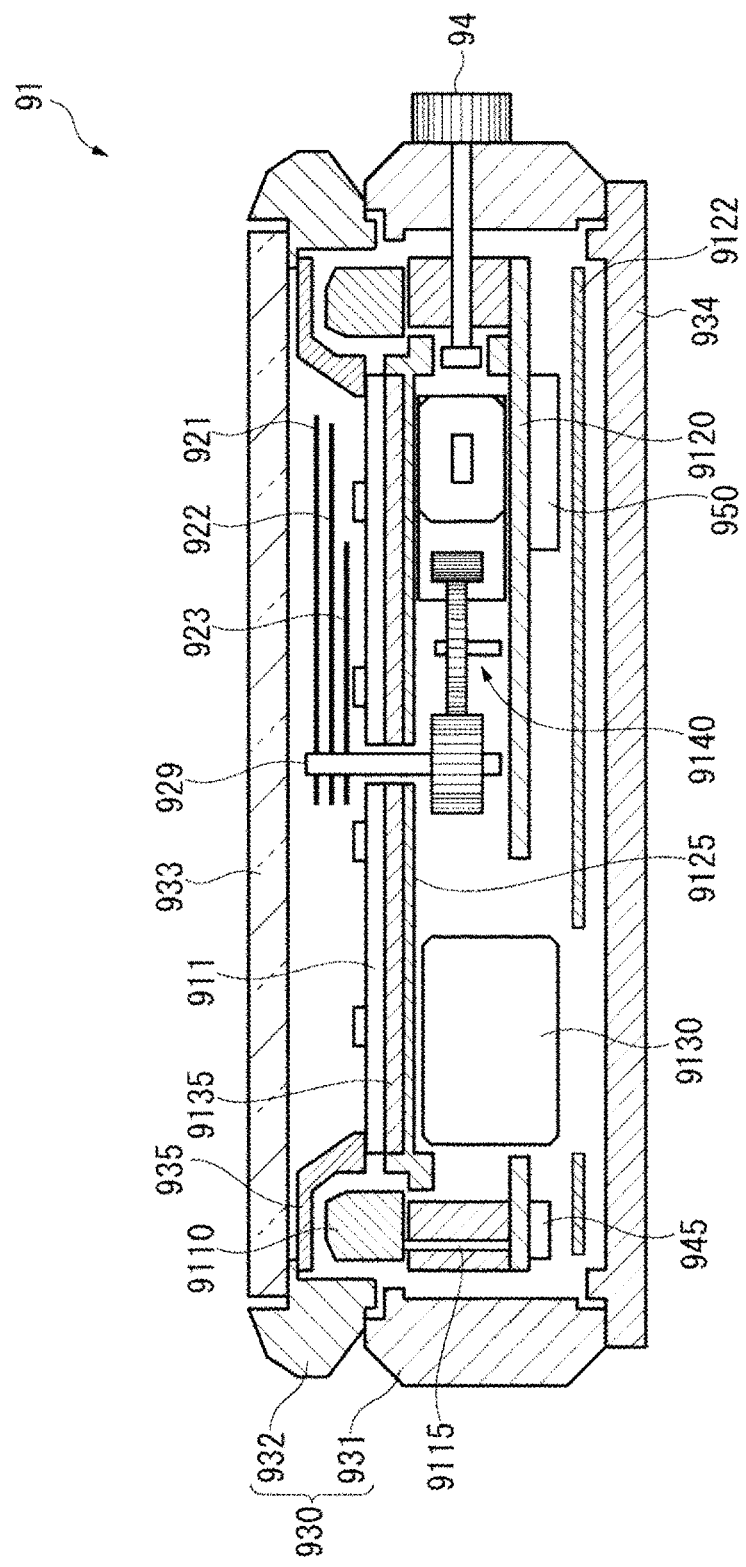
FIG. 17 is a longitudinal cross-sectional view of the electronic timepiece shown in FIG. 16.

FIG. 16 is a plan view showing the variation of the electronic timepiece that is the electronic instrument according to the embodiment of the present disclosure. FIG. 17 is a longitudinal cross-sectional view of the electronic timepiece shown in FIG. 16.

An electronic timepiece 91 includes an exterior case 930, a cover glass plate 933, and a case back 934, as shown in FIG. 16. The exterior case 30 is formed of a cylindrical case main body 931 and a bezel 932 fit thereinto. A disc-shaped dial 911 is disposed as a time display portion in the region inside the inner circumference of the bezel 932 via a ring-shaped dial ring 935.

The side surface of the exterior case 930 is provided with an A button 92, a B button 93, and a crown 94, and the A button 92, the B button 93, and the crown 94 are located in positions corresponding to 2 o'clock, 4 o'clock, and 3 o'clock, respectively, around the center of the dial 911.

In the electronic timepiece 91, the case main body 931 made of a metal has two openings, with the opening on the front side closed with the cover glass plate 933 via the bezel 932 and the opening on the rear side closed with the case back 934, as shown in FIG. 17.

The following components are provided in the exterior case 930: The dial ring 935 attached to the inner circumference of the bezel 932; the dial 911, which transmits light; indicating hands 921 to 924; a calendar wheel 920; and a drive mechanism 9140, which drives the indicating hands 921 to 924 and the calendar wheel 920.

The dial ring 935 includes a flat plate portion that is parallel to the cover glass plate 933 and an inclining portion that inclines toward the dial 911. The flat plate portion and the inclining portion of the dial ring 935 and the inner circumferential surface of the bezel 932 form a donut-shaped accommodation space, and a ring-shaped antenna body 9110 is accommodated in the accommodation space.

The dial 911 is a circular plate that is disposed in the exterior case 930 and displays the time, and the dial 911 is made, for example, of a light transmissive material, such as a plastic material. The indicating hands 921 to 924 and other components are provided between the dial 911 and the cover glass plate 933.

A solar cell 9135, which performs photovoltaic power generation, is provided between the dial 911 and a main plate 9125, to which the drive mechanism 9140 is attached. That is, the solar cell 9135 is provided on the rear side of the dial 911. The solar cell 9135 receives light having passed through the dial 911 to perform photovoltaic power generation.

The solar cell 9135 is a circular flat plate formed of a plurality of photovoltaic devices that are connected in series to each other and convert optical energy into electrical energy, and the solar cell 9135 is the photoelectric conversion module according to an embodiment of the present disclosure, as the solar cell 80 described above is. The solar cell 9135 includes the thin film sections 8171 and the thick film sections 8172 formed on the passivation film 817, as in the electronic timepiece 200 described above, as shown in FIG. 16. In FIG. 16, part of the thick film sections 8172 forms letters, and the thin film sections 8171 form the background. Since the light reflected off the thin film sections 8171 differs from the light reflected off the thick film sections 8172 in terms of color, the observer who observes the reflected light passing through the dial 911 can recognize the presence of the letters. That is, according to the present embodiment, the letters or the like can be placed on the light receiving surface of the solar cell 9135 with no use of paint or any other material. The stylish design of the electronic timepiece can therefore be enhanced with the photoelectric conversion efficiency of the cells (photoelectric converters) provided in the solar cell 9135 increased.

Holes through which an indicating hand shaft 929 for the indicating hands 921 to 923 and an indicating shaft for the indicating hand 924, the latter shaft being not shown, pass through are formed in the dial 911, the solar cell 9135, and the main plate 9125. An opening that forms a calendar small window 919 is formed in the dial 911 and the solar cell 9135.

The drive mechanism 9140 is attached to the main plate 9125, and the rear surface of the drive mechanism 9140 is covered with a circuit substrate 9120. The drive mechanism 9140 includes a stepper motor and a wheel train formed, for example, of gears, and the stepper motor rotates the indicating hand shaft 929 and the like via the wheel train to drive the indicating hands 921 to 924, a calendar wheel 920, and the like.

The circuit substrate 9120 includes a GPS reception circuit 945 and a controller 950. The circuit substrate 9120 and the antenna body 9110 are connected to each other via an antenna connection pin 9115. A circuit presser 9122 is provided on the side facing a surface of the circuit substrate 9120 that is the surface provided with the GPS reception circuit 945 and the controller 950 and facing the case back 934, and the circuit presser 9122 covers the circuit parts on the circuit substrate 9120. A secondary battery 9130, such as a lithium ion battery, is provided between the main plate 9125 and the case back 934. The secondary battery 9130 is charged with the power generated by the solar cell 9135.

Also in the electronic timepiece 91 described above, which is what is called an analog electronic timepiece, the letters or the like can be placed on the light receiving surface of the solar cell 9135 with no use of paint or any other material, whereby the stylish design of the electronic timepiece can be enhanced with no decrease in the photoelectric conversion efficiency.

The present disclosure has been described above based on the embodiments shown in the drawings, but the present disclosure is not limited to the embodiments.

For example, the photoelectric converter, the photoelectric conversion module, and the electronic instrument according to each of the embodiments of the present disclosure may be so configured that part of the elements in the embodiment described above is replaced with an arbitrary element having the same function or an arbitrary element is added to the embodiment described above.

The embodiments described above each relate to a photoelectric converter of the rear surface electrode type, and the present disclosure is also applicable to a photoelectric converter having electrodes provided also on the light receiving surface. In this case, an inorganic material having light transmittance and electrical conductivity is used as the material of which the inorganic film is made. Also in this case, the effect described above, that is, a photoelectric converter in which the letters or the like are placed on the light receiving surface and which has high photoelectric conversion efficiency can be achieved.

Examples of the inorganic material may include an indium oxide (IC)), an indium tin oxide (ITO), a fluorine-doped tin oxide (FTO), a zinc oxide (ZnO), and a variety of other metal oxides.

Example

A specific example of the present disclosure will next be described.

1. Preparation of Test Piece for Evaluation

The following test piece for evaluation was first prepared.

Test Piece for Evaluation

Si substrate: single-crystal silicon substrate (refractive index: 3.88)

Passivation film (inorganic film): silicon nitride (refractive index: 2.10)

Thickness of passivation film: 85 to 100 nm

2. Method for Evaluating Test Piece for Evaluation

Light from a CIE standard light source $D_{65}$ was then caused to be incident on the passivation film on the test piece for evaluation at an angle of incidence of 45°. The specularly reflected light was then analyzed with a color meter, and the result of the analysis was expressed in an L*a*b colorimetric system.

3. Results of Evaluation of Test Piece for Evaluation

Figure 18:
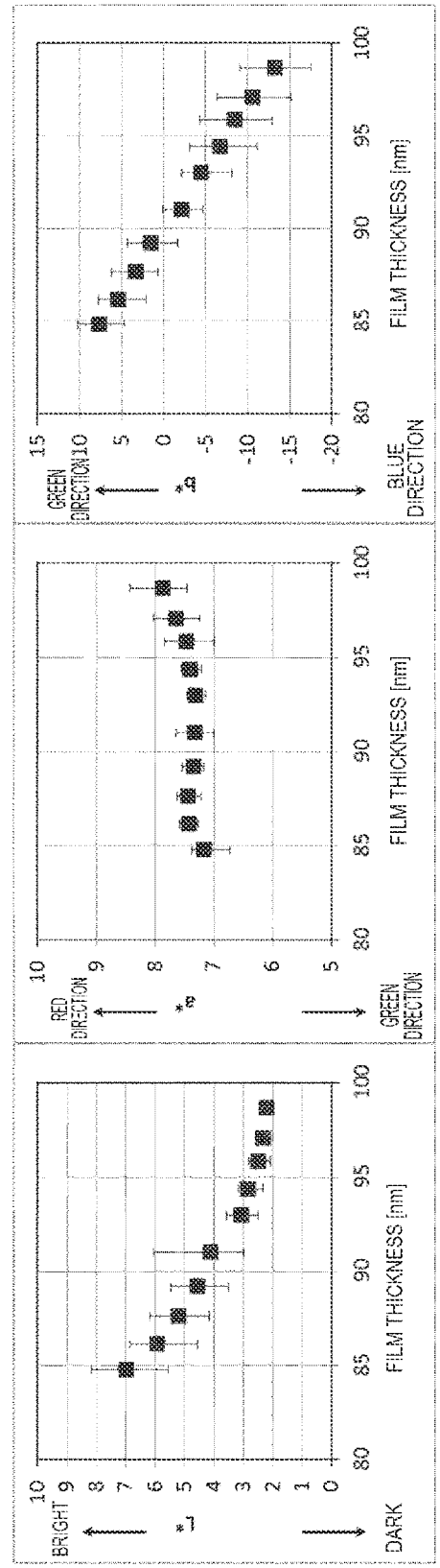
FIG. 18 shows results of evaluation of the color of light reflected off a passivation film with the results plotted in a coordinate system having the horizontal axis representing the film thickness and the vertical axis representing lightness L*, chromaticity a*, or chromaticity b*.

FIG. 18 shows results of evaluation of the color of the light reflected off the passivation film with the results plotted in a coordinate system having the horizontal axis representing the film thickness and the vertical axis representing the lightness L*, the chromaticity a*, or the chromaticity b*.

FIG. 18 clearly shows that the lightness L*, the chromaticity a*, or the chromaticity b* is controllable by changing the thickness of the passivation film.

Figure 19:
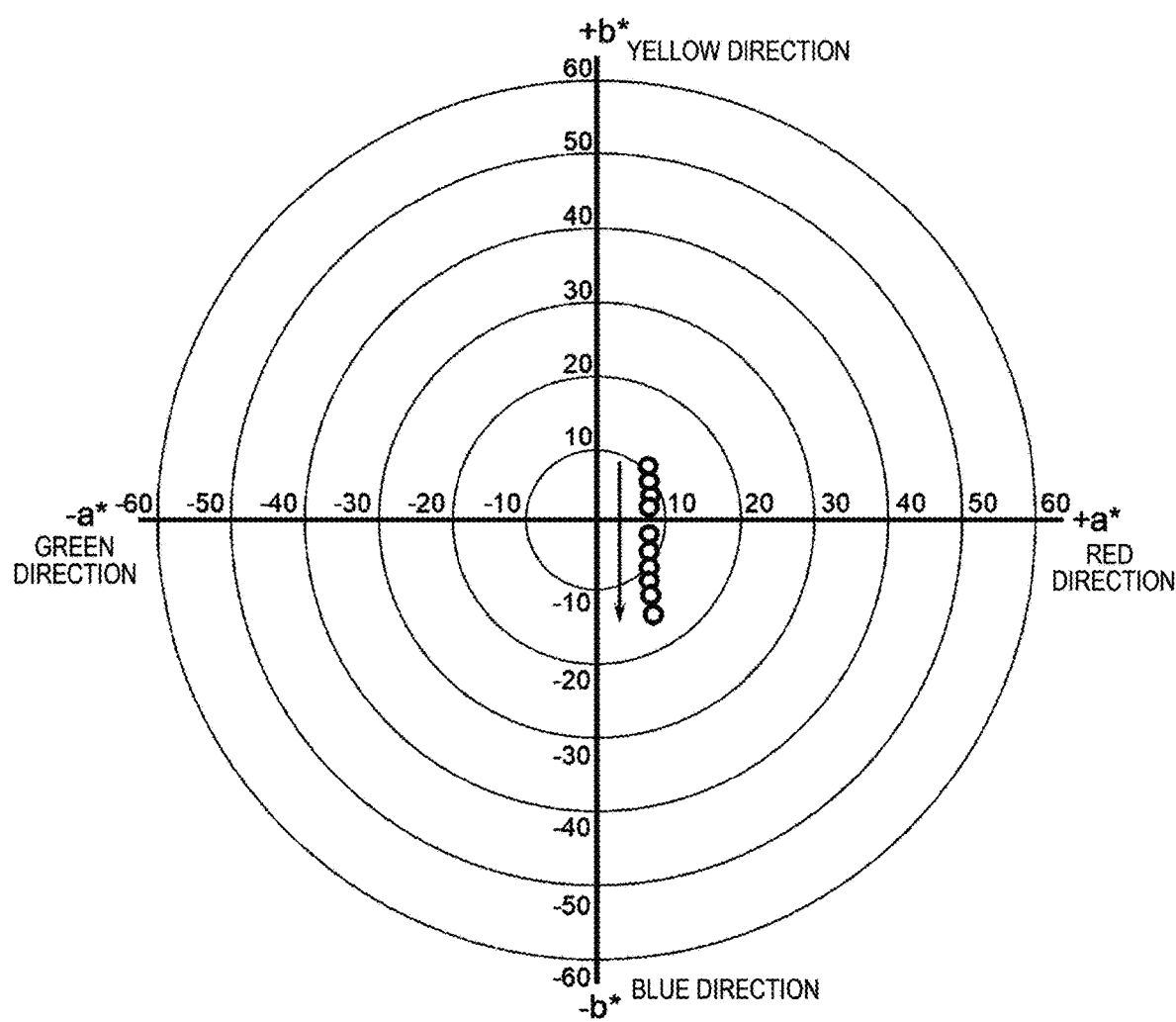
FIG. 19 shows the chromaticity a* and the chromaticity b*, which are part of the evaluation results shown in FIG. 18, plotted in an L*a*b* colorimetric system chromaticity diagram.

FIG. 19 shows the chromaticity a* and the chromaticity b*, which are part of the evaluation results shown in FIG. 18, plotted in an L*a*b* colorimetric system chromaticity diagram. The arrow shown in FIG. 19 represents the direction in which the plotted point moves when the film thickness is increased.

The results of the present evaluation show that changing the film thickness can change the color of the light reflected off the passivation film, as shown in FIG. 19. Further, since the change in the color correlates with the change in the film thickness in a fixed manner, FIG. 19 also shows that a color can be created arbitrarily to some extent.

What is claimed is:

1. A photoelectric converter comprising:
a crystalline silicon substrate having a light receiving surface and an electrode surface which is a rear surface of the light receiving surface, the light receiving surface including a plurality of smooth sections and a plurality of rough surface sections having surface roughness greater than surface roughness of the smooth sections, the plurality of smooth sections and the plurality of rough surface sections being alternately arranged along the light receiving surface; and
a light transmissive inorganic film so provided as to overlap with the smooth sections and the rough surface sections,
wherein a film thickness t1 of a portion of the inorganic film that is a portion where the inorganic film overlaps with the rough surface sections is smaller than a film thickness t2 of a portion of the inorganic film that is a portion where the inorganic film overlaps with the smooth sections, each of the plurality of rough surface includes a respective plurality of irregularities having an arbitrary shape, the plurality of the irregularities of any rough surface section having no smooth section between the plurality of the irregularities, the plurality of the irregularities of one rough surface section and the plurality of the irregularities of another rough surface section adjacent to the one rough surface section being separated by a smooth surface section therebetween, the plurality of the irregularities include a plurality of pyramidal protrusions formed along the light receiving surface, and the electrode surface has a passivation film and part of an electrode pad, the part of the electrode pad being between the light receiving surface and the passivation film in a thickness direction of the crystalline silicon substrate and being exposed via the passivation film, wherein the electrode surface includes p-type via wiring line and n-type via wiring line.

2. The photoelectric converter according to claim 1, wherein arithmetic average roughness of the plurality of the rough surface sections is greater than or equal to 0.1 μm.

3. The photoelectric converter according to claim 2, wherein a difference in the arithmetic average roughness between the plurality of the rough surface section and the plurality of the smooth sections is greater than or equal to 0.01 μm.

4. The photoelectric converter according to claim 1, wherein the film thickness t1 is greater than or equal to 40% of the film thickness t2 but smaller than or equal to 95% of the film thickness t2.

5. The photoelectric converter according to claim 1, wherein an area of the "the plurality of the rough surface section" and "the plurality of the smooth sections" is greater than an area of the smooth sections.

6. The photoelectric converter according to claim 1, wherein the inorganic film contains a silicon compound or a metal oxide.

7. The photoelectric converter according to claim 1, wherein the silicon substrate has single crystallinity.

8. A photoelectric conversion module comprising:
the photoelectric converter according to claim 1; and
a wiring substrate so provided as to overlap with the photoelectric converter and be electrically connected to the electrode pad.

9. An electronic instrument comprising the photoelectric converter according to claim 1.

* * * * *